United States Patent
Kato

(10) Patent No.: US 9,643,220 B2
(45) Date of Patent: May 9, 2017

(54) SUBSTRATE PROCESSING METHOD FOR TRANSFERRING A SUBSTRATE

(71) Applicant: SCREEN Holdings Co., Ltd., Kyoto (JP)

(72) Inventor: Hiroshi Kato, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 15/093,281

(22) Filed: Apr. 7, 2016

(65) Prior Publication Data

US 2016/0221045 A1 Aug. 4, 2016

Related U.S. Application Data

(62) Division of application No. 13/787,987, filed on Mar. 7, 2013, now abandoned.

(30) Foreign Application Priority Data

Jun. 18, 2012 (JP) ................. 2012-137104

(51) Int. Cl.
*H01L 21/67* (2006.01)
*B08B 3/04* (2006.01)
(Continued)

(52) U.S. Cl.
CPC ............ *B08B 3/04* (2013.01); *H01L 21/6719* (2013.01); *H01L 21/67046* (2013.01);
(Continued)

(58) Field of Classification Search
CPC ................ B08B 3/04; H01L 21/67742; H01L 21/67748; H01L 21/67754;
(Continued)

(56) References Cited

U.S. PATENT DOCUMENTS 5,498,294 A 3/1996 Matsushita et al.
6,842,932 B2 1/2005 Ishihara
(Continued)

FOREIGN PATENT DOCUMENTS

CN 1685080 10/2005
CN 101552220 10/2009
(Continued)

OTHER PUBLICATIONS

Office Action issued by Chinese Patent Office on Jul. 31, 2015 in connection with corresponding Chinese Application No. 2013100829867.

(Continued)

*Primary Examiner* — Katelyn Whatley
(74) *Attorney, Agent, or Firm* — Ostrolenk Faber LLP

(57) ABSTRACT

A substrate processing apparatus includes a transferring unit disposed in a connecting part of a washing processing cell and an indexer cell. The transferring unit includes an inverting support portion for supporting a substrate in a horizontal posture, a feed supporting portion disposed at an interval in a vertical direction from the inverting support portion for supporting the substrate in the horizontal posture, and an interposing and inverting mechanism for inverting the substrate to be supported by the inverting support portion and bringing the inverted substrate to be supported by the inverting support portion again. A part of the substrate to be supported by a feed supporting portion is disposed in an inversion region for the substrate to be inverted by the interposing and inverting mechanism.

2 Claims, 10 Drawing Sheets

(51) Int. Cl.
*H01L 21/677* (2006.01)
*H01L 21/68* (2006.01)
*H01L 21/687* (2006.01)

(52) U.S. Cl.
CPC .. *H01L 21/67051* (2013.01); *H01L 21/67207* (2013.01); *H01L 21/67706* (2013.01); *H01L 21/67718* (2013.01); *H01L 21/67769* (2013.01); *H01L 21/67781* (2013.01); *H01L 21/68* (2013.01); *H01L 21/68707* (2013.01)

(58) Field of Classification Search
CPC ......... H01L 21/67766; H01L 21/67781; H01L 21/68764; H01L 21/67051; H01L 21/6719; H01L 21/67769; H01L 21/68
USPC .................................................. 134/62, 137
See application file for complete search history.

(56) References Cited

U.S. PATENT DOCUMENTS

| | | |
|---|---|---|
| 7,087,117 B2 | 8/2006 | Katsuoka et al. |
| 7,442,257 B2 | 10/2008 | Katsuoka et al. |
| 7,451,515 B2 | 11/2008 | Uemukai et al. |
| 7,575,636 B2 | 8/2009 | Katsuoka et al. |
| 7,878,213 B2 | 2/2011 | Mitsuyoshi |
| 9,022,046 B2 | 5/2015 | Machida |
| 2002/0059686 A1 | 5/2002 | Uemukai |
| 2005/0022325 A1 | 2/2005 | Uemukai et al. |
| 2005/0072358 A1 | 4/2005 | Katsuoka et al. |
| 2006/0236929 A1 | 10/2006 | Katsuoka et al. |
| 2006/0243204 A1 | 11/2006 | Katsuoka et al. |
| 2006/0243205 A1 | 11/2006 | Katsuoka et al. |
| 2008/0156351 A1 | 7/2008 | Mitsuyoshi et al. |
| 2008/0156357 A1 | 7/2008 | Mitsuyoshi |
| 2009/0252578 A1 | 10/2009 | Machida |
| 2012/0016516 A1 | 1/2012 | Machida |
| 2012/0143366 A1 | 6/2012 | Machida |

FOREIGN PATENT DOCUMENTS

| | | |
|---|---|---|
| JP | 63156640 A  * | 6/1988 |
| JP | S63-156640 | 6/1988 |
| JP | 10-321575 | 12/1998 |
| JP | H10-321575 | 12/1998 |
| JP | 2004-241552 | 8/2004 |
| JP | 2008-166368 | 7/2008 |
| JP | 2009-146975 | 7/2009 |
| JP | 4287663 | 7/2009 |
| JP | 2009-252888 | 10/2009 |

OTHER PUBLICATIONS

Office Action issued by Japanese Patent Office on Jan. 19, 2016 in connection with corresponding Japanese Application No. 2012-137104.

Office Action dated May 26, 2015 in corresponding Japanese Patent Application No. 2012-137104 with English translation.

Decision to Grant issued by Korean Patent Office on Dec. 23, 2014 in connection with corresponding Korean Patent Application No. 10-2013-0027831.

* cited by examiner

SUBSTRATE PROCESSING METHOD FOR TRANSFERRING A SUBSTRATE

The present application is a divisional under 37 C.F.R. §1.53(b) of prior application Ser. No. 13/787,987 filed Mar. 7, 2013 by Hiroshi Kato entitled SUBSTRATE PROCESSING APPARATUS AND SUBSTRATE PROCESSING METHOD

BACKGROUND OF THE INVENTION

Field of the Invention

The present invention relates to a technique for carrying out processing over a plurality of semiconductor substrates, a glass substrate for a liquid crystal display device, a glass substrate for a plasma display, a glass substrate for a photomask, a substrate for an optical disk or the like (which will be hereinafter referred to as a "substrate").

Description of the Background Art

There are various substrate processing apparatus for carrying out processing over a substrate. For example, the substrate processing apparatus disclosed in Japanese Patent Application Laid-Open No. 2009-146975 has the structure in which the indexer cell for accumulating the unprocessed substrate and the processed substrate and the washing processing cell for carrying out scrub washing processing over the substrate are connected to each other through the substrate transferring portion. The special transport robot for each cell is disposed in the indexer cell and the washing processing respectively.

In the substrate processing apparatus of this type, an inverting portion for inverting a front surface and a back surface of a substrate is sometimes provided in the device to prepare for the case in which the back surface of the substrate is washed. For example, in the substrate processing apparatus disclosed in the Japanese Patent Application Laid-Open No. 2009-146975, the inverting portion is disposed in the washing processing cell. Moreover, Japanese Patent Application Laid-Open No. 10-321575 (1998) describes the inverting and washing unit for inverting the substrate and washing the back surface thereof. Furthermore, Japanese Patent Application Laid-Open No. 2009-252888 and Japanese Patent No. 4287663 describe the structure in which the front surface and the back surface of the substrate are inverted through the relay portion between the transport robots.

In the structure of the device in which the inverting portion for inverting the front surface and the back surface of the substrate is disposed in the relay portion between the transport robots, the substrate delivered into the inverting portion by one of the transport robots can be transferred by the other transport robot after the inversion. In other words, the functioning portion for inverting the substrate can be used as a portion for transferring the substrate between the transport robots. According to the structure, for example, it is possible to decrease the number of steps of the transport robot as compared with the device structure in which the inverting portion is disposed in a position where only one of the transport robots can give access. As a result, it is possible to enhance a throughput of the substrate processing apparatus.

On the other hand, it is necessary to shorten a standby time for each transport robot as greatly as possible in order to suppress reduction in the throughput of the substrate processing apparatus. For example, when the transport robot tries to send the substrate to the transferring portion, the transport robot is to wait for the other transport robot to transport the substrate from the transferring portion if the transferring portion is full of the substrate. In order to avoid such a situation as greatly as possible, it is preferable that the transferring portions should be provided in the relay portion between the transport robots.

In recent years in which increase in a size of the substrate progresses, a space required for inverting the substrate is enlarged. Consequently, a size of the inverting portion is being increased. For this reason, in the case in which the relay portion is provided with necessary numbers of transferring portions and inverting portions in lamination, for example, a travel distance (a stroke) in a vertical direction of a hand of the transport robot is increased depending on increase in a height dimension of the inverting portion, which is directly linked to reduction in the throughput.

SUMMARY OF THE INVENTION

The present invention is directed to a substrate processing apparatus for carrying out predetermined processing over a substrate. According to the present invention, the substrate processing apparatus includes the following portions: a processing block having a front surface washing portion for washing a front surface of a substrate, a back surface washing portion for washing a back surface of a substrate, and a first transport robot; an indexer block having a second transport robot and serving to transfer an unprocessed substrate to the processing block and to receive a processed substrate from the processing block; and a transferring unit disposed in a connecting part of the processing block and the indexer block. The transferring unit includes the following portions: a first supporting portion for supporting a substrate in a horizontal posture; a second supporting portion disposed at an interval in a vertical direction from the first supporting portion for supporting a substrate in a horizontal posture; and an inverting mechanism for inverting the substrate to be supported by the first supporting portion and bringing the inverted substrate to be supported by the first supporting portion again. A part of the substrate to be supported by the second supporting portion is disposed in an inversion region of the substrate to be inverted by the inverting mechanism.

According to the aspect, the transferring unit includes the first supporting portion and the second supporting portion which are disposed at an interval in the vertical direction. Therefore, it is possible to transfer the substrate between the first transport robot and the second transport robot through at least one of the first supporting portion and the second supporting portion. In particular, it is possible to invert and transfer the substrate through the first supporting portion. The second supporting portion supports the substrate in the inversion region for the substrate to be inverted by the inverting mechanism. Therefore, it is possible to reduce a height dimension of the transferring unit. Consequently, it is possible to reduce travel distances in the vertical direction of the first transport robot and the second transport robot. Thus, it is possible to enhance a throughput.

In the substrate processing apparatus according to another aspect of the present invention, it is preferable that an unprocessed substrate should be transferred from the second transport robot to the first transport robot by exclusively using the first supporting portion and the second supporting portion.

According to the aspect, the unprocessed substrate is transferred by exclusively using the first supporting portion and the second supporting portion. According to the structure, there is not caused a situation in which the first supporting portion and the second supporting portion are used for transferring the unprocessed substrate at the same time. Therefore, it is possible to reliably avoid a situation in which the substrate supported by the second supporting portion and the substrate to be inverted interfere with each other.

In the substrate processing apparatus according to a further aspect of the present invention, it is preferable that a path for transferring the unprocessed substrate from the second transport robot to the first transport robot should be selectively switched between a transferring path through the first supporting portion and a transferring path through the second supporting portion depending on a recipe set every substrate group.

According to the aspect, the path for transferring the unprocessed substrate from the second transport robot to the first transport robot is selectively switched between the transferring path through the first supporting portion and the transferring path through the second supporting portion depending on the recipe set every substrate group. According to the structure, for example, the device can automatically select the transferring path to carry out the processing through selection of the processing for only the front surface or the processing for both sides depending on the recipe.

In the substrate processing apparatus according to a further aspect of the present invention, it is preferable that the second supporting portion should be disposed on an upper side of the first supporting portion.

According to the aspect, the second supporting portion is disposed on the upper side of the first supporting portion. According to the structure, a path for passage of the unprocessed substrate to be transferred through the second supporting portion (that is, the unprocessed substrate to be transferred without inversion with the front surface turned upward) is formed on the upper side of the inverting mechanism. Accordingly, it is hard for the front surface of the unprocessed substrate to be contaminated with particles or the like which are generated by the inverting mechanism.

In the substrate processing apparatus according to a further aspect of the present invention, it is preferable that the transferring unit should include the following portion: a third supporting portion disposed on an upper side of the second supporting portion for supporting a substrate in a horizontal posture, and a processed substrate is transferred from the first transport robot to the second transport robot through the third supporting portion.

According to the aspect, the processed substrate is transferred from the first transport robot to the second transport robot through the third supporting portion disposed on the upper side of the second supporting portion. According to the structure, the path for passage of the processed substrate is formed on the upper side of the path for passage of the unprocessed substrate. Therefore, it is possible to maintain the front surface of the processed substrate to be clean.

In the substrate processing apparatus according to a further aspect of the present invention, it is preferable that there should be provided a plurality of the first supporting portions and the inverting mechanism should invert a plurality of substrates supported by the first supporting portions at a time.

According to the aspect, it is possible to invert a plurality of substrates at a time. Therefore, it is possible to enhance a throughput in the substrate processing apparatus.

Moreover, the present invention is also directed to a substrate processing method of carrying out predetermined processing over a substrate.

Therefore, it is an object of the present invention to provide a technique capable of enhancing the throughput of the substrate processing apparatus.

These and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiment according to the present invention will be described below with reference to the accompanying drawings. The following preferred embodiment is only illustrative as the present invention and does not restrict the technical range of the present invention.

In the following description, a "front surface" of a substrate indicates a plane of a main surface of the substrate where a pattern (for example, a circuit pattern) is to be formed, and a "back surface" indicates a plane at an opposite side to the front surface. Moreover, an "upper surface" of the substrate indicates a plane of the main surface of the substrate which is turned upward, and a "lower surface" indicates a plane turned downward (irrespective of the front surface or the back surface).

<1. Structure of Substrate Processing Apparatus 1>

Figure 1:
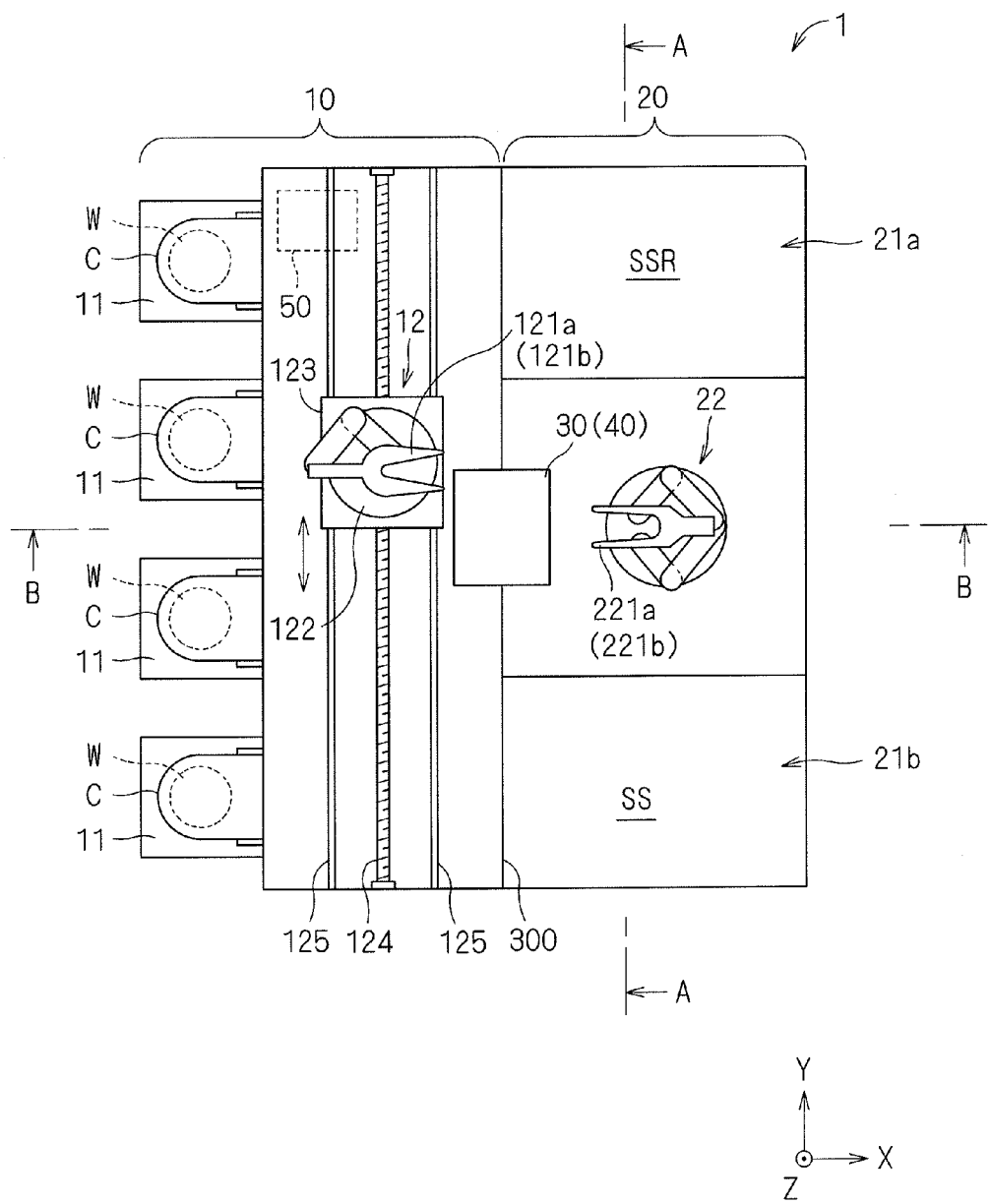
FIG. 1 is a plan view showing a substrate processing apparatus.
Figure 2:
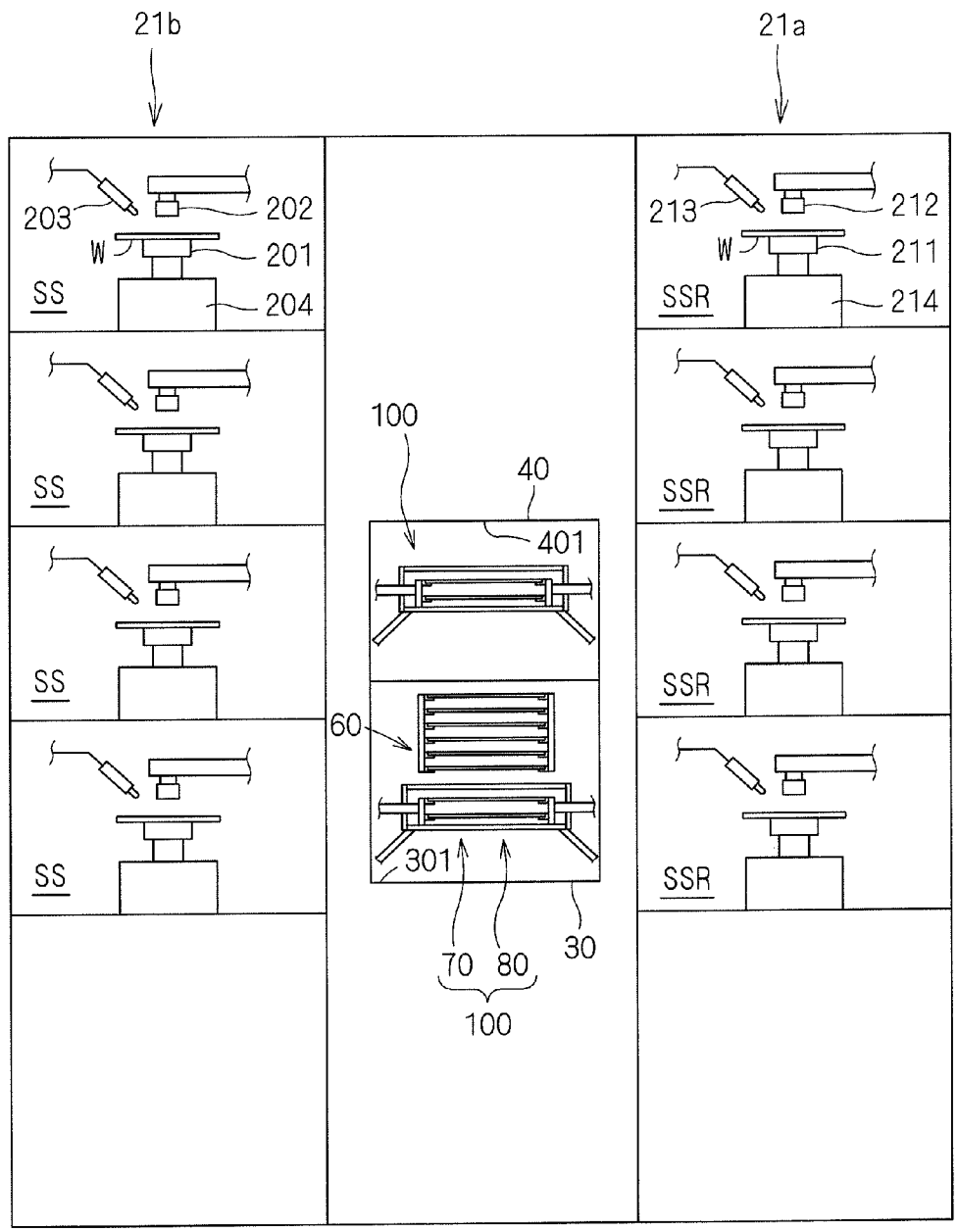
FIG. 2 is a view showing the substrate processing apparatus seen along an A-A line in FIG. 1.
Figure 3:
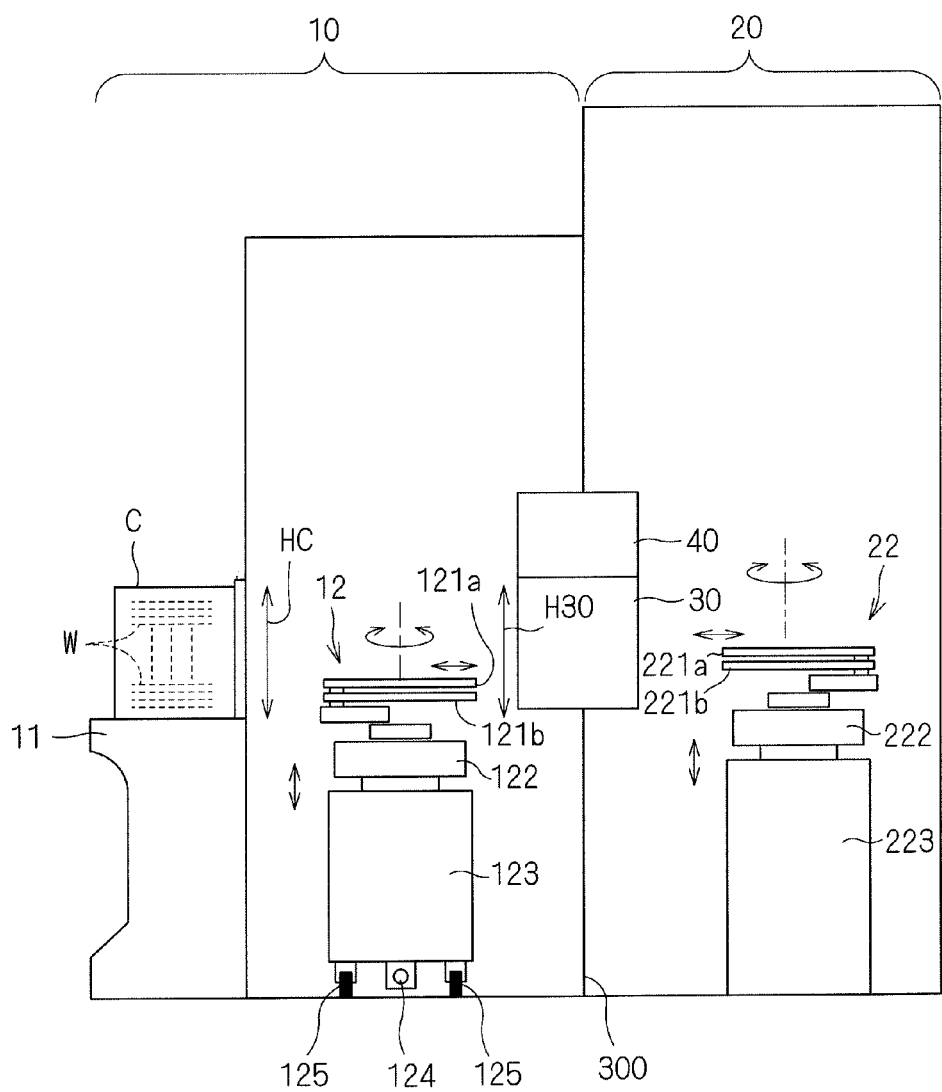
FIG. 3 is a view showing the substrate processing apparatus seen along a B-B line in FIG. 1.

A structure of a substrate processing apparatus 1 according to a preferred embodiment will be described with reference to FIGS. 1 and 2. FIG. 1 is a plan view showing the substrate processing apparatus 1. FIG. 2 is a view showing the substrate processing apparatus 1 seen along an A-A line in FIG. 1. FIG. 3 is a view showing the substrate processing apparatus 1 seen along a B-B line in FIG. 1. An XYZ rectangular coordinate system in which a Z-axis direction is set to be a vertical direction and an XY plane is set to be a horizontal plane is properly attached to each drawing to which reference will be made below.

The substrate processing apparatus 1 is a washing device for continuously carrying out scrub washing processing over a plurality of substrates W, for example, semiconductor wafers, and has a structure in which two cells (processing blocks), that is, an indexer cell 10 and a washing processing cell 20 are provided side by side. Moreover, the substrate processing apparatus 1 includes respective portions (a transferring unit 30 and an inverting portion 40) provided between the indexer cell 10 and the washing processing cell 20. Furthermore, the substrate processing apparatus 1 includes a control portion 50 for controlling respective operating mechanisms provided in the indexer cell 10 and the washing processing cell 20, thereby causing them to execute the washing processing for the substrate W.

<Indexer Cell 10>

The indexer cell 10 serves to transfer the substrate W (the unprocessed substrate W) received from an outside of the device to the washing processing cell 20, and furthermore, to deliver the substrate W (the processed substrate W) received from the washing processing cell 20 to the outside of the device. The indexer cell 10 includes a plurality of (four in the preferred embodiment) carrier stages 11 for putting a carrier C thereon, and a transfer robot 12 (a second transport robot) for taking the unprocessed substrate W out of each carrier C and accommodating the processed substrate W to the carrier C.

The carrier C having the unprocessed substrate W accommodated therein is delivered in from the outside of the device by means of an AGV (Automated Guided Vehicle) or the like and is thus put on each carrier stage 11. Moreover, the substrate W subjected to the scrub washing processing in the device is stored in the carrier C put on the carrier stage 11 again. The carrier C storing the processed substrate W therein is delivered to the outside of the device by means of the AGV or the like. In other words, the carrier stage 11 functions as a substrate accumulating portion for accumulating the unprocessed substrate W and the processed substrate W. A configuration of the carrier C may be an SMIF (Standard Mechanical Inter Face) pod or an OC (open cassette) for exposing the accommodated substrate W to outside air in addition to an FOUP (front opening unified pod) for accommodating the substrate W in a closed space.

The transfer robot 12 includes two transfer arms 121a and 121b, an arm stage 122 for mounting them thereon, and a movable table 123.

The movable table 123 is fixed into a ball screw 124 extended in parallel with an alignment of the carrier stage 11 (in a Y-axis direction), and furthermore, is provided slidably with respect to two guide rails 125. When the ball screw 124 is rotated by means of a rotating motor which is not shown, accordingly, the whole transfer robot 12 including the movable table 123 is moved horizontally in the Y-axis direction.

The arm stage 122 is mounted on the movable table 123. The movable table 123 includes a motor for turning and driving the arm stage 122 around an axis in the vertical direction (the Z-axis direction) and a motor for moving the arm stage 122 upward and downward in the vertical direction (neither of which is shown). The transfer arms 121a and 121b are provided on the arm stage 122 at a predetermined pitch in upward and downward directions. Both of the transfer arms 121a and 121b are formed like a fork seen on a plane. Each of the transfer arms 121a and 121b supports a lower surface of the single substrate W in the forked part. Moreover, articulated mechanisms of the respective transfer arms 121a and 121b carry out a bending and stretching operation by means of a driving mechanism (not shown) provided in the arm stage 122 so that they can be independently moved forward and backward in a horizontal direction (a turning radial direction of the arm stage 122), respectively.

By the structure, the respective transfer arms 121a and 121b can carry out a horizontal movement in the Y-axis direction, an upward and downward movement, a turning operation in the horizontal plane, and a forward and backward movement in the turning radial direction. The transfer robot 12 causes the transfer arms 121a and 121b supporting the substrate W through the forked parts to give access to each portion (more specifically, each of the carrier C mounted on the carrier stage 11 and the transferring unit 30), thereby transferring the substrate W between the respective portions.

<Washing Processing Cell 20>

The washing processing cell 20 serves to carry out the scrub washing processing over the substrate W, and includes two washing processing units 21a and 21b and a transport robot 22 (a first transport robot) for transferring the substrate W to the respective washing processing units 21a and 21b.

The two washing processing units 21a and 21b are disposed opposite to each other with the transport robot 22 interposed therebetween. In the two washing processing units 21a and 21b, the washing processing unit 21b on a minus Y side of the transport robot 22 has a structure in which at least one (four in the preferred embodiment) front surface washing processing portion SS is disposed in lamination in the vertical direction. On the other hand, the other washing processing unit 21a (that is, the washing processing unit 21a on a plus Y side of the transport robot 22) has a structure in which at least one (four in the preferred embodiment) back surface washing processing portion SSR is disposed in lamination in the vertical direction.

The front surface washing processing portion SS carries out the scrub washing processing over the front surface of the substrate W. More specifically, the front surface washing processing portion SS includes a spin chuck 201 for holding the substrate W having the front surface turned upward in a horizontal posture and rotating the substrate W around an axis in the vertical direction, a washing brush 202 for abutting on or approaching the front surface of the substrate W held on the spin chuck 201 to carry out the scrub washing, a nozzle 203 for discharging a washing solution (for example, pure water) to the front surface of the substrate W, a spin motor 204 for rotating and driving the spin chuck 201, a cup (not shown) for surrounding the substrate W held on the spin chuck 201, and the like, for instance.

The back surface washing processing portion SSR carries out the scrub washing processing over the back surface of the substrate W. More specifically, the back surface washing processing portion SSR includes a spin chuck 211 for holding the substrate W having the back surface turned upward in a horizontal posture and rotating the substrate W around an axis in the vertical direction, a washing brush 212 for abutting on or approaching the back surface of the substrate W held on the spin chuck 211 to carry out the scrub washing, a nozzle 213 for discharging a washing solution (for example, pure water) to the back surface of the substrate W, a spin motor 214 for rotating and driving the spin chuck 211, a cup (not shown) for surrounding the substrate W held on the spin chuck 211, and the like, for instance. The spin chuck 201 of the front surface washing processing portion SS for carrying out the front surface washing may be of a vacuum adsorbing type for holding the substrate W from a back surface side. However, the spin chuck 211 of the back surface washing processing portion SSR for carrying out the back surface washing is to be of a type for mechanically gripping an edge part of the substrate W.

The transport robot 22 includes two transport arms 221a and 221b, an arm stage 222 for mounting them thereon, and a base table 223. The base table 223 is fixedly provided on a frame of the washing processing cell 20. Accordingly, the whole transport robot 22 is not moved in a horizontal direction.

The arm stage 222 is mounted on the movable table 223. The movable table 223 includes a motor for turning and driving the arm stage 222 around an axis in the vertical direction (the Z-axis direction) and a motor for moving the arm stage 222 upward and downward in the vertical direction (neither of which is shown). The transport arms 221a and 221b are provided on the arm stage 222 at a predetermined pitch in upward and downward directions. Both of the transport arms 221a and 221b are formed like a fork seen on a plane. Each of the transport arms 221a and 221b supports the lower surface of the single substrate W in the forked part. Moreover, articulated mechanisms of the respective transport arms 221a and 221b carry out a bending and stretching operation by means of a driving mechanism (not shown) provided in the arm stage 222 so that they can be independently moved forward and backward in a horizontal direction (a turning radial direction of the arm stage 222), respectively.

By the structure, the transport robot 22 causes the two transport arms 221a and 221b to individually give access to each portion (more specifically, each of the washing processing units 21a and 21b, the transferring unit 30 and the inverting portion 40), thereby transferring the substrate W between the respective portions. As an up-down driving mechanism for the transport robot 22, it is also possible to employ another mechanism such as a belt feeding mechanism using a pulley and a timing belt.

<Transferring Unit 30>

In the substrate processing apparatus 1, the washing processing cell 20 is provided adjacently to the indexer cell 10, and an atmosphere intercepting partition wall 300 is provided between the indexer cell 10 and the washing processing cell 20. The transferring unit 30 is provided in penetration through a part of the partition wall 300. In other words, the transferring unit 30 is provided in a connecting part of the indexer cell 10 and the washing processing cell 20 and is used for transferring the substrate W between the transfer robot 12 and the transport robot 22. A structure of the transferring unit 30 will be described later.

<Inverting Portion 40>

The inverting portion 40 is provided in penetration through a part of the partition wall 300 and is disposed on an upper side of the transferring unit 30 in lamination. In other words, the inverting portion 40 is also provided in the connecting part of the indexer cell 10 and the washing processing cell 20.

The inverting portion 40 is a processing portion for inverting the front surface and the back surface of the substrate W by 180 degrees. The inverting portion 40 has a structure in which a substrate inverting device 100 to be described below is accommodated in a box-shaped housing 401. However, only the transport robot 22 can give access to an inner part of the housing 401. In other words, in the housing 401, an opening is not formed on a wall portion at the indexer cell 10 side but an opening (not shown) for causing the transport arms 221a and 221b of the transport robot 22 to give access to the inner part of the housing 401 is formed on only a wall portion at the washing processing cell 20 side.

<Control Portion 50>

The control portion 50 controls various operating mechanisms provided in the substrate processing apparatus 1. A hardware structure of the control portion 50 is the same as that of a general computer. In other words, the control portion 50 includes a CPU for carrying out a large variety of calculation processing, an ROM to be a read only memory for storing a basic program, an RAM to be a readable/writable memory for storing various information, and a magnetic disk for storing controlling software and data, and the like.

<2. Transferring Unit 30>

<2-1. Structure>

Figure 4:
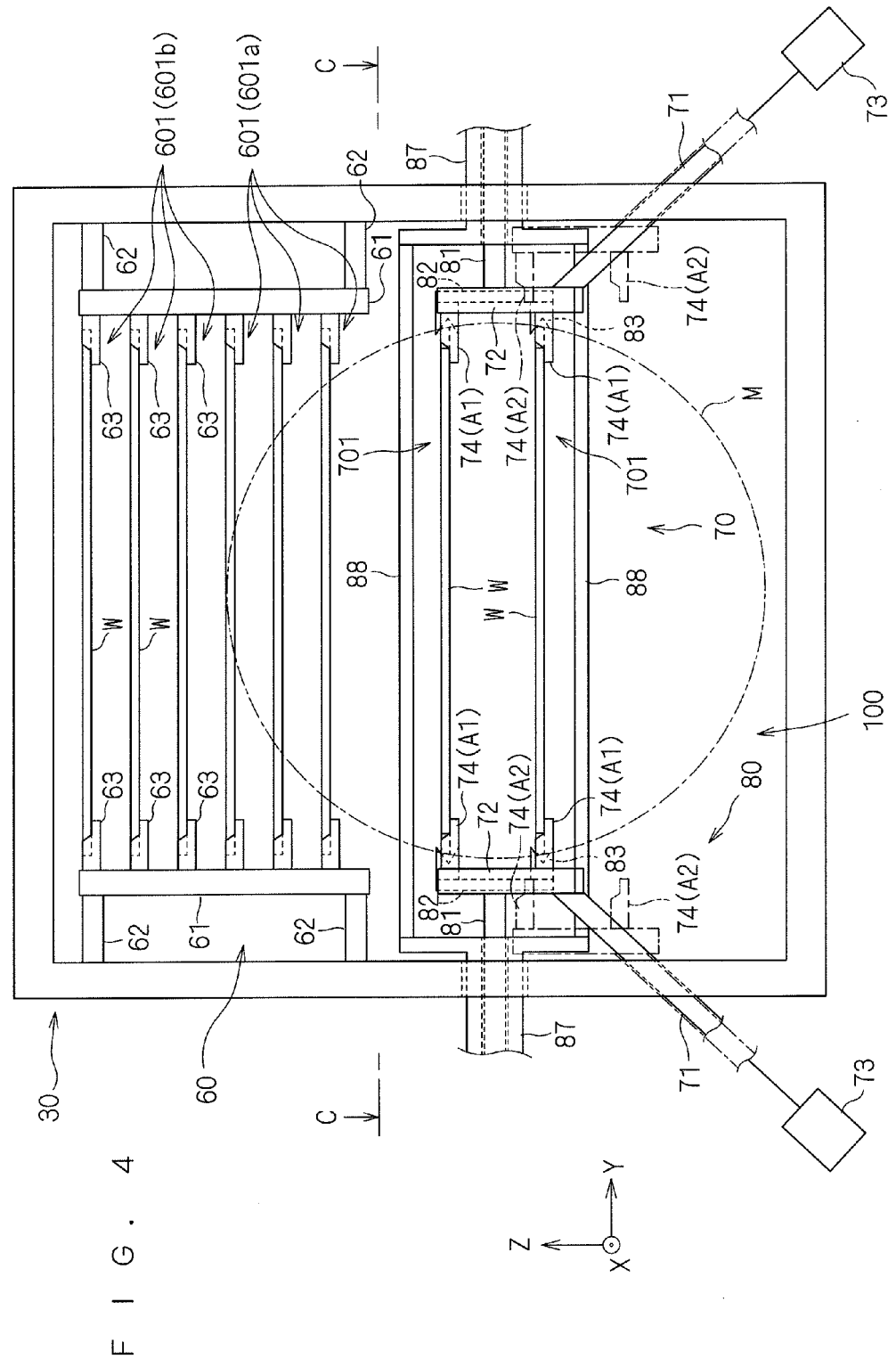
FIG. 4 is a side view showing a transferring unit.
Figure 5:
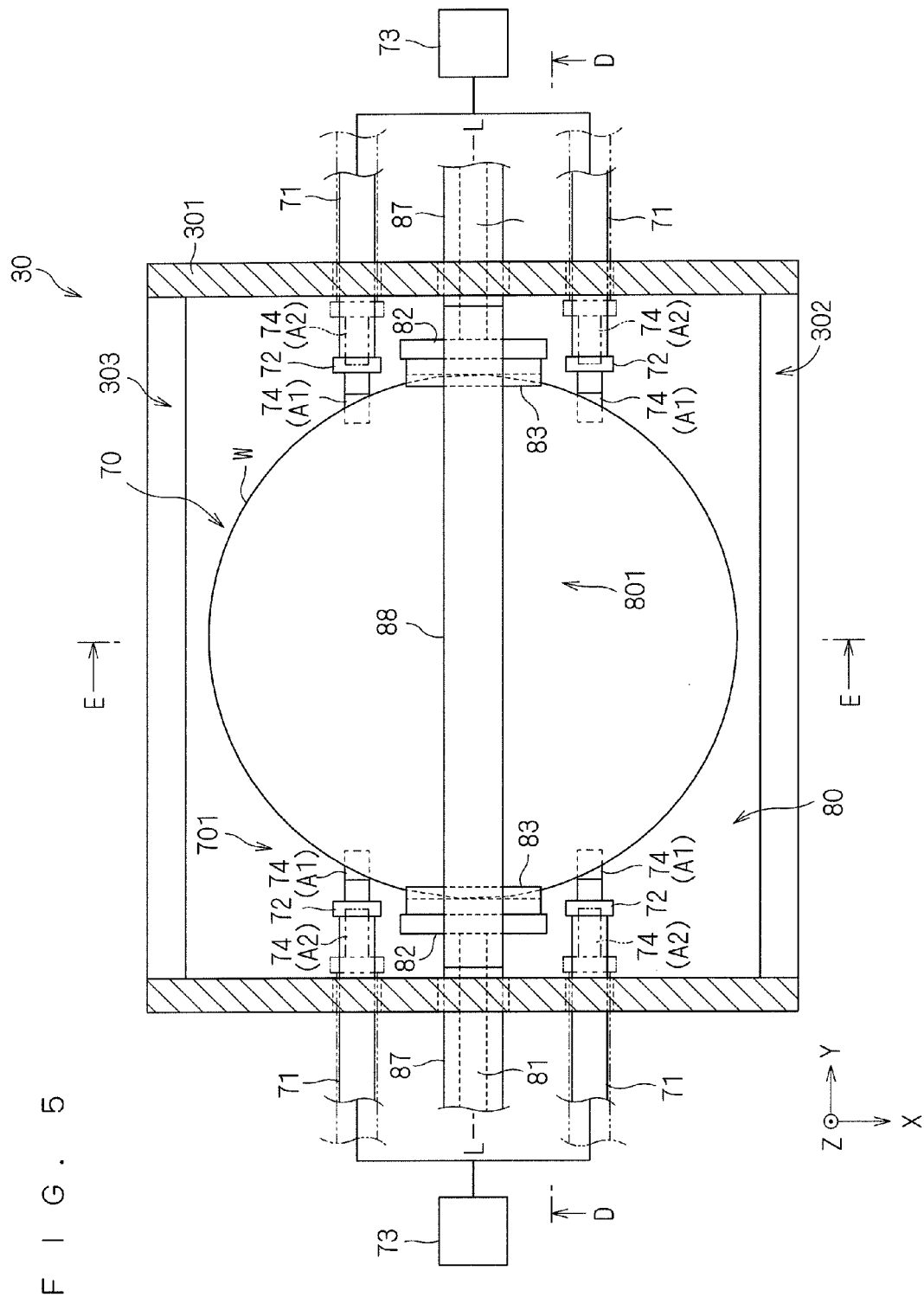
FIG. 5 is a plan view showing the transferring unit seen along a C-C line in FIG. 4.
Figure 6:
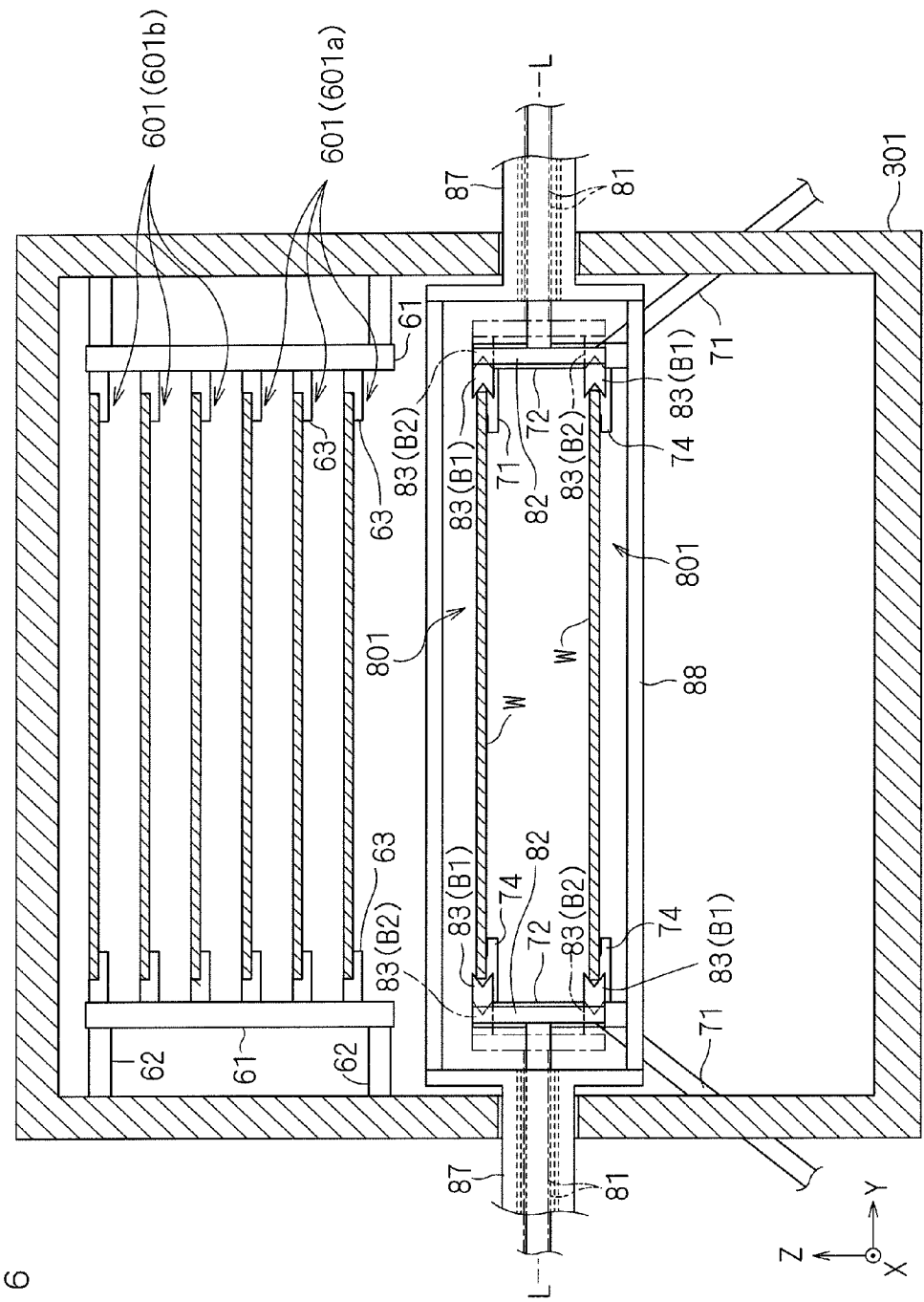
FIG. 6 is a sectional side view showing the transferring unit seen along a D-D line in FIG. 5.
Figure 7:
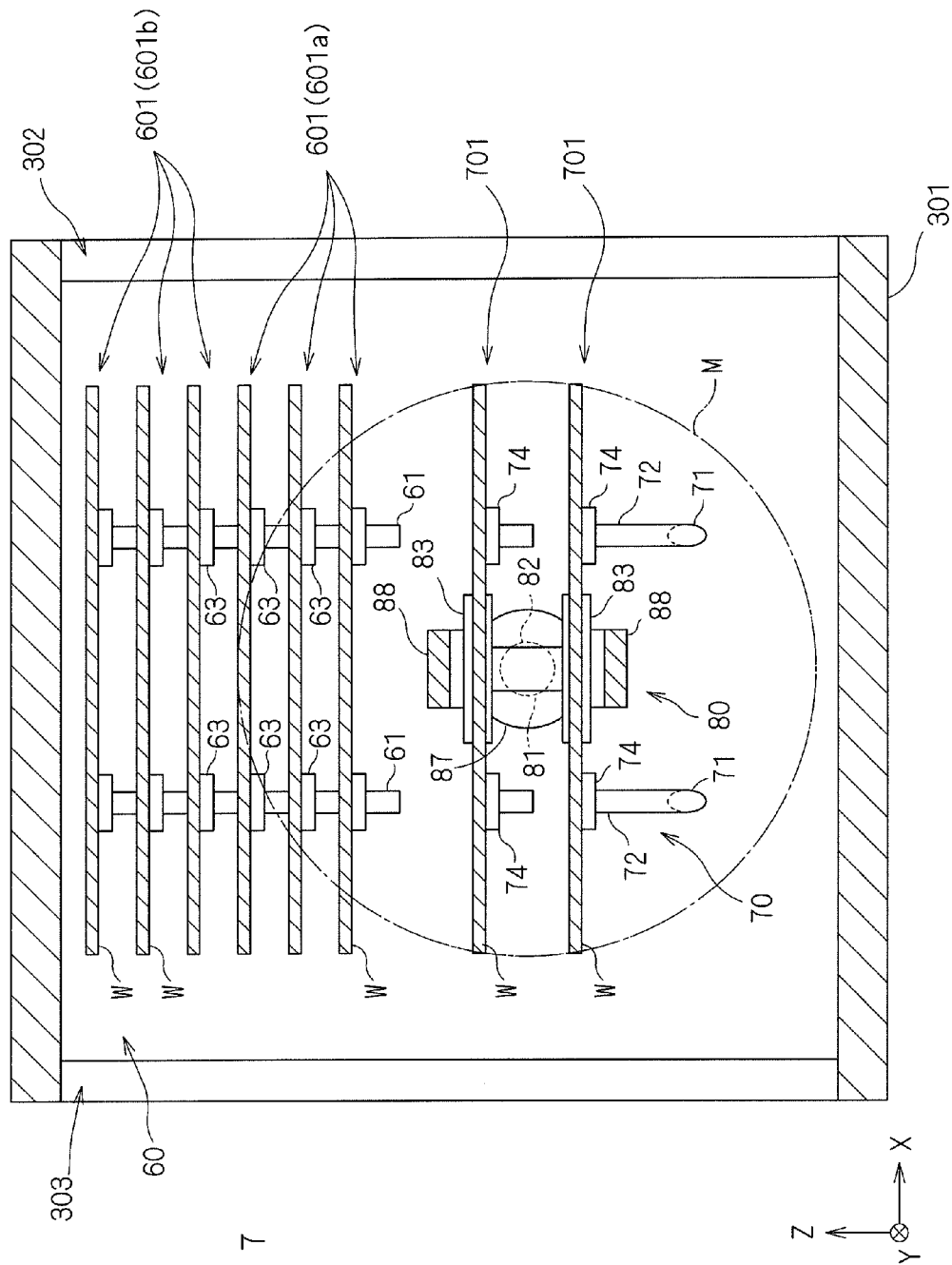
FIG. 7 is a sectional side view showing the transferring unit seen along an E-E line in FIG. 5.
Figure 8:
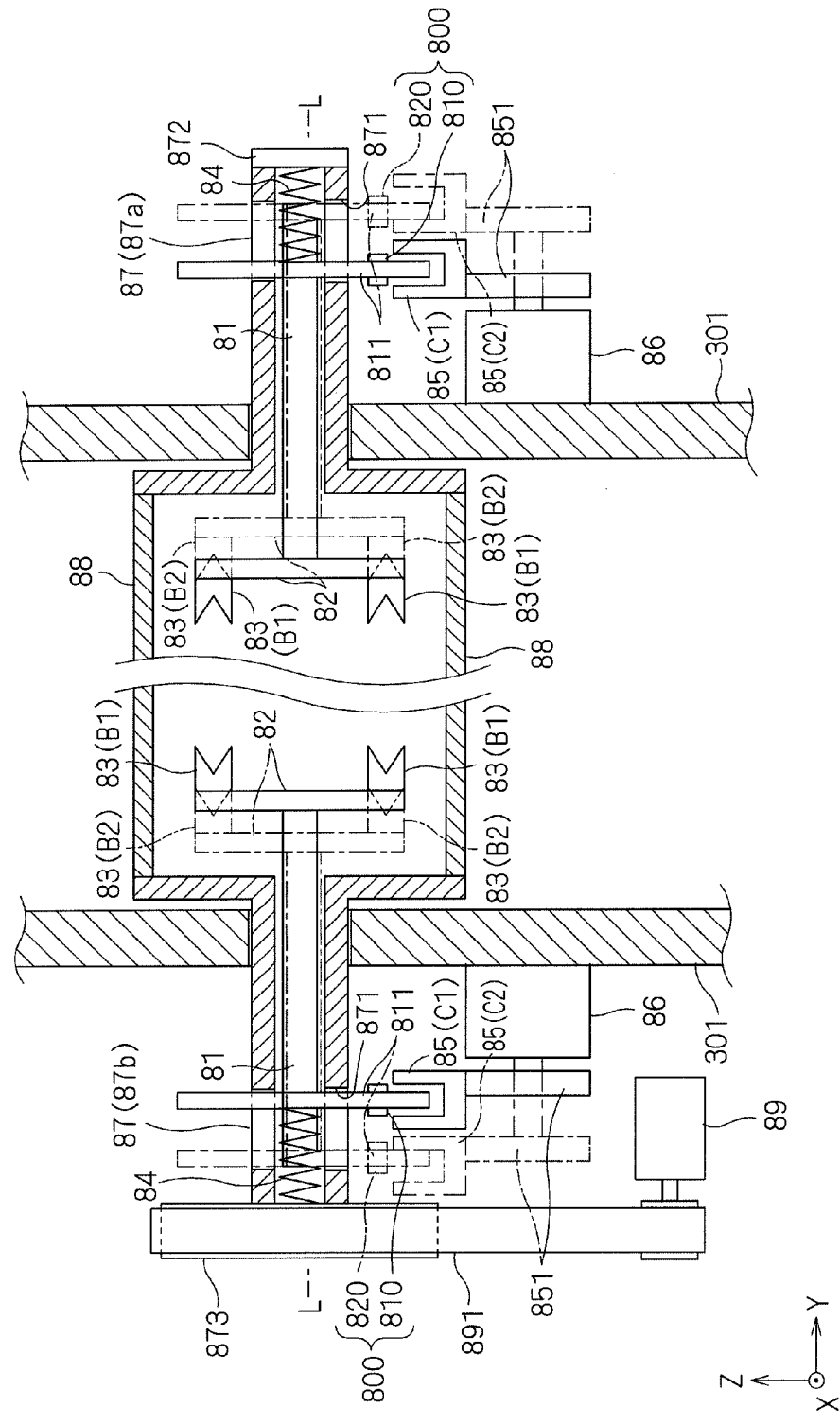
FIG. 8 is a partial enlarged view showing a main part of an inverting mechanism.

The structure of the transferring unit 30 will be described with reference to FIGS. 4 to 8. FIG. 4 is a side view showing the transferring unit 30. FIG. 5 is a plan view showing the transferring unit 30 seen along a C-C line in FIG. 4. FIG. 6 is a sectional side view showing the transferring unit 30 seen along a D-D line in FIG. 5. FIG. 7 is a sectional side view showing the transferring unit 30 seen along an E-E line in FIG. 5. FIG. 8 is a partial enlarged view showing a main part of an interposing and inverting mechanism 80. For convenience of explanation, each of FIGS. 4 to 7 shows a state in which the substrate W is supported on all of support portions 601 and all of inverting support portions 701, respectively. As will be apparent below, in the substrate processing apparatus 1 according to the preferred embodiment, the substrate W is not supported on a feed supporting portion 601a and the inverting support portion 701 at the same time during an operation.

As described above, the transferring unit 30 is provided in the connecting part of the indexer cell 10 and the washing processing cell 20 and is used for transferring the substrate W between the transfer robot 12 and the transport robot 22. More specifically, the transferring unit 30 mainly includes a supporting unit 60 having a plurality of (six in the preferred embodiment) supporting units 601 for supporting the substrate W in a horizontal posture, an supporting mechanism 70 disposed on a lower side of the supporting unit 60 and having a plurality of (two in the preferred embodiment) inverting support portions 701 for supporting the substrate W in a horizontal posture, and an interposing and inverting mechanism 80 for inverting the substrate W supported by the inverting support portion 701 and bringing the inverted substrate W to be supported by the inverting support portion 701 again, and these portions 60, 70 and 80 are disposed in a housing 301. The supporting mechanism 70 and the interposing and inverting mechanism 80 constitute the substrate inverting device 100 for inverting the substrate W. In other words, the support unit 60 and the substrate inverting device 100 are disposed in a vertical arranging state in the housing 301. The substrate inverting device 100 functions as an inverting portion for inverting the substrate W and also functions as a portion for transferring the substrate W between the transfer robot 12 and the transport robot 22.

Both the transfer robot 12 and the transport robot 22 can give access to an inner part of the housing 301. In other words, an opening 302 is formed on a wall portion at the washing processing cell 20 side (a plus X side) in a wall portion of the housing 301. The opening 302 serves to cause the transport arms 221a and 221b of the transport robot 22 to give access to the inner part of the housing 301. Moreover, an opening 303 is formed on a wall portion at the indexer cell 10 side (a minus X side) in the wall portion of the housing 301. The opening 303 serves to cause the transfer arms 121a and 121b of the transfer robot 12 to give access to the inner part of the housing 301. In the following explanation, the side (the plus X side) on which the opening 302 for causing the transport arms 221a and 221b of the transport robot 22 to give access is formed will be referred to as a "front side" and the side (the minus X side) on which the opening 303 for causing the transfer arms 121a and 121b of the transfer robot 12 to give access is formed will be referred to as a "rear side". Moreover, an orthogonal direction (the Y-axis direction) to a longitudinal direction (an X-axis direction) and a vertical direction (the Z-axis direction) will be referred to as a "transverse direction".

<i. Supporting Unit 60>

Two supporting columns 61 are provided close to left and right side wall portions of the housing 301 in the side wall portions, respectively. The respective supporting columns 61 are fixed to the side wall portions disposed close thereto through a coupling bar 62, for example, and are caused to take a posture extended in a vertical portion in parallel with the side wall portions. The two supporting columns 61 fixed to the side wall portion on the same side are disposed at a longitudinal interval with mutual extending directions set to be parallel with each other. In each of the left and right side wall portions, moreover, the supporting columns 61 provided on the relatively front side are opposed to each other in the transverse direction as seen in the vertical direction, and the supporting columns 61 provided on the relatively rear side are also opposed to each other in the transverse direction as seen in the vertical direction.

Each of the supporting columns 61 is provided with a plurality of (six in the preferred embodiment) supporting members 63 arranged vertically at a regular interval. Each of the supporting members 63 is a long plate-shaped member which is supported on the supporting column 61 in an open sided state, and is extended in the transverse direction in a horizontal plane from a fixed end attached to the supporting column 61 and thus reaches a free end. An upper surface of the supporting member 63 takes a shape of a step having an inclined surface in the middle of the extension, and an almost horizontal plane which is relatively lower than the fixed end side is formed at the free end side. The horizontal plane on the free end side constitutes an abutting surface to abut on the lower surface of the substrate W, and each of abutting surfaces of four supporting members 63 disposed in the same horizontal plane abuts on the lower surface side of the substrate W so that the substrate W is supported in a horizontal posture as will be apparent below. The abutting surface does not always need to be the horizontal plane but may be a surface which is slightly inclined to be lower toward a tip of the supporting member 63. In the supporting member 63, the inclined surface formed to be linked to the abutting surface functions as a position regulating surface for regulating a position of an edge of the substrate W. In other words, each of the inclined surfaces in the four supporting members 63 disposed in the same horizontal plane regulates a position of the edge of the substrate W so that a position in the horizontal plane of the substrate W is regulated.

The supporting members 63 provided in respective uppermost stages of the four supporting columns 61 disposed in the housing 301 are located in the same horizontal plane and constitute a single supporting member group. Similarly, the supporting members 63 provided in two to six stages of each of the four supporting columns 61 are also disposed in the same horizontal plane and constitute a single supporting member group. The single substrate W is supported, from the lower surface side, on the four supporting members 63 constituting the single supporting member group and is thus supported in a horizontal posture in a predetermined position. In other words, the single supporting member group forms the supporting portion 601 for supporting the single substrate W in the horizontal posture.

Thus, six supporting portions 601 are provided at an interval in the vertical direction in the supporting unit 60. Consequently, six substrates W at a maximum can be supported in a lamination state at an interval in the vertical direction in the horizontal posture.

Three upper ones of the six supporting portions 601 provided in the supporting unit 60 are used for transferring the processed substrate W from the washing processing cell 20 to the indexer cell 10, and will be hereinafter referred to as a "return supporting portion 601b". On the other hand, the residual supporting portions 601 (that is, three lower supporting portions 601) are used for transferring the unprocessed substrate W from the indexer cell 10 to the washing processing cell 20, and will be hereinafter referred to as the "feed supporting portion 601a".

The supporting portion 601 provided in the supporting unit 60 is disposed at an interval from the inverting support portion 701 at an upper side of the inverting support portion 701. In at least one (three in the illustrated example) in three of the six supporting portions 601 which are disposed on the relatively lower side (that is, three supporting portions 601 to be used as the feed supporting portions 601a), the horizontal plane where four supporting members 63 constituting the supporting portion 601 are disposed intersects (interferes) with an inversion region M for the substrate W to be inverted by the interposing and inverting mechanism 80. Accordingly, the supporting portion 601 supports the substrate W in a state in which a part of the substrate W is disposed in the inversion region M. The supporting portion 601 thus supporting the substrate W in a position interfering with the inversion region M will be hereinafter referred to as an "interference supporting portion". However, all of the supporting members 63 (even if the supporting members 63 constitute the interference supporting portion) are disposed on an outside of the inversion region M.

<ii. Supporting Mechanism 70>

Two oblique shaft portions 71 are provided to slidably penetrate through the left and right side wall portions of the housing 301 in the side wall portions. The two oblique shaft portions 71 provided in the respective side wall portions are disposed longitudinally at an interval with mutual extending directions set in parallel with each other. In the left and right side wall portions, moreover, the oblique shaft portions 71 provided on the relatively front side are opposed to each other in the transverse direction as seen in the vertical direction, and the oblique shaft portions 71 provided on the relatively rear side are also opposed to each other in the transverse direction as seen in the vertical direction.

An upper end of the oblique shaft portion 71 which is protruded to the inner part of the housing 301 is provided with a supporting column 72 which is extended in the vertical direction. On the other hand, a lower end of the oblique shaft portion 71 which is protruded to the outside of the housing 301 is coupled to a cylinder 73. The two oblique shaft portions 71 provided on the same side wall portions are coupled to the same cylinder 73 through a coupling bar (not shown). In other words, the lower ends of the two oblique shaft portions 71 are coupled to the vicinity of an end at the front side and the vicinity of an end at the rear side in the coupling bar extended in a longitudinal direction respectively, and the cylinder 73 is coupled to the coupling bar. According to the structure, the two oblique shaft portions 71 coupled to the cylinders 73 through the coupling bars are moved synchronously upon receipt of a driving operation of the cylinders 73.

A supporting member 74 extended in the transverse direction in the horizontal plane is attached to the vicinity of an upper end and that of a lower end in the supporting column 72 in an open sided state. The supporting member 74 can have the same structure as that of the supporting member 63 provided in the supporting unit 60. As will be apparent below, each of abutting surfaces of four supporting members 74 disposed in the same horizontal plane abuts on the lower surface side of the substrate W so that the substrate W is supported in the horizontal posture. Moreover, each of inclined surfaces of the four supporting members 74 disposed in the same horizontal plane regulates the position of the edge of the substrate W so that the position of the substrate W in the horizontal plane is regulated.

The supporting members 74 provided on the respective upper ends of four supporting columns 72 disposed in the housing 301 are located in the same horizontal plane and thus constitute a single supporting member group. Moreover, the supporting members 74 provided on the respective lower ends of the four supporting columns 72 are also located in the same horizontal plane and thus constitute a single supporting member group. The single substrate W is supported on the four supporting members 74 constituting the single supporting member group from the lower surface side and is thus supported in the horizontal posture in a predetermined position. In other words, the single supporting member group forms the supporting portion (the inverting support portion) 701 for supporting the single substrate W in the horizontal posture.

In the inverting support mechanism 70, thus, two inverting support portions 701 are provided at an interval in the vertical direction. Consequently, two substrates W can be supported in a lamination state at an interval in the vertical direction in the horizontal posture.

Two oblique shaft portions 71 opposed to each other in the transverse direction as seen in the vertical direction (that is, disposed opposite to each other with a transverse center line of the substrate W supported by the inverting support portion 701 interposed therebetween) are set to be a pair of oblique shaft portions 71. Each of the oblique shaft portions 71 is extended in an obliquely downward direction (that is, a downward direction apart from the other oblique shaft portion 71 opposed in the transverse direction) from the upper end coupled to the supporting column 72, and thus reaches the lower end coupled to the cylinder 73.

The cylinder 73 slides each of the oblique shaft portions 71 in the extending direction. In other words, the cylinder 73 slides the oblique shaft portion 71 in an obliquely downward direction along the extending direction to move the supporting member 74 from a supporting position A1 (that is, a position in which the supporting member 74 abuts on the lower surface of the substrate W over the abutting surface to support the substrate W) to a waiting position A2 (that is, a predetermined position in which the supporting member 74 separates from the lower and side surfaces of the substrate W). According to the structure, the supporting member 74 placed in the supporting position A1 is moved in the obliquely downward direction (in other words, is moved downward apart from the transverse center line of the substrate W (more specifically, apart from a center of the substrate W as seen in the vertical direction)), and is thus disposed in the waiting position A2. In other words, the supporting member 74 placed in the supporting position A1 is moved in a simultaneous separating direction from both of the lower and side surfaces of the substrate W (more specifically, side surface parts where the inclined surfaces of the supporting member 74 are opposed to each other), and is thus disposed in the waiting position A2.

However, the waiting position A2 is set to a position on an outside of a peripheral edge of the substrate W as seen in the vertical direction. The waiting position A2 is placed on an outside of the region (inversion region) M through which each substrate W to be inverted by the interposing and inverting mechanism 80 passes. Accordingly, the supporting member 74 disposed in the waiting position A2 is secured in order not to interfere with the substrate W to be inverted. Moreover, it is preferable that the waiting position A2 should be set onto an upper side of a supporting position of the substrate W at the lower side (a supporting position of the substrate W supported on the lower side of the substrate W to be supported by the supporting member 74).

Moreover, the cylinder 73 slides the oblique shaft portion 71 in an obliquely upward direction along the extending direction, thereby moving the supporting member 74 from the waiting position A2 to the supporting position A1. In other words, the supporting member 74 placed in the waiting position A2 is moved reversely to the path and is thus moved from the waiting position A2 to the supporting position A1.

It is sufficient that a direction in which the supporting member 74 is to be moved is inclined at a greater angle than zero with respect to the horizontal direction, and a specific value of the angle can be regulated based on a clearance in the vertical direction between the substrates W supported by the inverting support portion 701 and a clearance between the peripheral edge of the substrate W and a position in which the supporting member 74 is caused to abut on the substrate W. Moreover, FIG. 5 shows a structure in which each supporting member 74 is moved in a direction along the Y axis apart from the center of the substrate W as seen in the vertical direction. However, it is also possible to employ a structure in which the supporting member 74 is moved along an axis extended radially from the center of the substrate W apart from the center of the substrate W as seen in the vertical direction.

<iii. Interposing and Inverting Mechanism 80>

A single slide shaft portion 81 is provided in slidable penetration through the left and right side wall portions of the housing 301 in the side wall portions. The single slide shaft portion 81 provided in each of the side wall portions is located between the two oblique shaft portions 71 disposed in the side wall portions. Moreover, the slide shaft portions 81 provided in the left and right side wall portions are opposed to each other in the transverse direction as seen in the vertical direction. Each of the slide shaft portions 81 is extended in the transverse direction in the horizontal plane, and a supporting column 82 extended in the vertical direction is provided on an end at a protruding side into the inner part of the housing 301. The supporting column 82 is coupled to the side shaft portion 81 in a central part in the vertical direction.

An interposing member 83 extended in the transverse direction in the horizontal plane is attached to upper and lower ends of the supporting column 82 in an open sided state. More specifically, the interposing member 83 includes a tapered surface having a section taking a V shape which the edge part of the substrate W enters. The interposing members 83 provided on the respective upper ends of the two supporting columns 82 disposed in the housing 301 are located in the same horizontal plane. Moreover, the interposing members 83 provided on the respective lower ends of the two supporting columns 82 are also disposed in the same horizontal plane. As will be apparent below, a pair of interposing members 83 disposed in the same horizontal plane interposes the substrate W from both edge parts in the radial direction of the substrate W.

As described above, the two slide shaft portions 81 are transversely disposed opposite to each other in the housing 301, and each of the two slide shaft portions 81 is extended in the transverse direction in the horizontal plane from an end at the side where the supporting column 82 is provided, and reaches the other end protruded to the outside of the housing 301. Each slide shaft portion 81 abuts on an elastic member 84 at the end on the protruding side to the outside of the housing 301. Specifically, the elastic member 84 is a coil spring, for example, and one of ends abuts on the end of the slide shaft portion 81 in a contraction state and the other end abuts on a pulley 873 (or a bottom plate 872) which will be described below. Accordingly, each slide shaft portion 81 is always energized by means of the elastic member 84 in such a direction as to separate from the pulley 873 (or the bottom plate 872), that is, such a direction as to approach the other slide shaft portion 81 which is transversely disposed opposite thereto.

With the structure, the pair of interposing members 83 disposed opposite to each other in the transverse direction in the same horizontal plane is always maintained to be elastically energized in such a direction as to approach each other. The pair of interposing members 83 is provided opposite to each other with the substrate W interposed therebetween and is elastically energized toward the side surface of the substrate W so that the substrate W is interposed in the horizontal posture. In other words, the single substrate W is interposed between the pair of the interposing members 83 disposed opposite to each other in the transverse direction from both edge parts in the radial direction of the substrate W so that it is interposed in the horizontal posture. The "edge part" of the substrate W indicates the side surface of the substrate W and a ring-shaped region of the upper and lower surfaces of the substrate W having a size of approximately several millimeters from the peripheral edge of the substrate W.

In the interposing and inverting mechanism 80, thus, the pair of interposing members 83 forms an interposing portion 801 for supporting the single substrate W in the horizontal posture, and two interposing portions 801 are provided at an interval in the vertical direction. Consequently, two substrates W can be interposed in a lamination state at an interval in the vertical direction in the horizontal posture. However, each of the two interposing portions 801 disposed apart from each other in the vertical direction is provided on the level with each of the two inverting support portions 701, and each of the interposing portions 801 can interpose the substrate W supported by each of the inverting support portions 701.

A protruded portion 811 is formed on an end of the slide shaft portion 81 at the protruding side toward the outside of the housing 301. The protruded portion 811 is protruded like a flange from the outer peripheral surface of the slide shaft portion 81. At least a part of a tip in the protruded portion 811 is inserted into a groove of a chute-shaped portion 85. The chute-shaped portion 85 is a member which is opened upward and forms a groove extended longitudinally, and a width of the groove is larger than that of the protruded portion 811. Moreover, ends on the front and rear sides of the groove are also opened. The chute-shaped portion 85 is fixed to a rod of a cylinder 86 through a supporting portion 851. However, the rod of the cylinder 86 is disposed in extension in the transverse direction in the horizontal plane. The protruded portion 811 is formed to take a semicircular shape as seen in the transverse direction, for example, and is formed in such a manner that at least a part of the tip of the protruded portion 811 is maintained to be inserted into the groove of the chute-shaped portion 85 also after the slide shaft portion 81 is rotated around a rotating axis L by 180 degrees.

The cylinder 86 reciprocates the chute-shaped portion 85 within a predetermined moving range along a moving axis extended in the transverse direction in the horizontal plane. In the following, an end position on the substrate W side within the moving range of the chute-shaped portion 85 will be referred to as a "closing side end position C1" and the other end position will be referred to as an "opening side end position C2".

When the cylinder 86 is moved in such a direction as to separate the chute-shaped portion 85 placed in the closing side end position C1 from the substrate W, the protruded portion 811 is caught on the chute-shaped portion 85 so that the slide shaft portion 81 is slid in such a direction as to separate from the substrate W together with the chute-shaped portion 85. Consequently, the interposing member (that is, the interposing member placed in an interposing position B1) 83 which is elastically energized toward the side surface of the substrate W is separated from the side surface of the substrate W and is moved in such a direction as to separate from the transverse center line of the substrate W in the horizontal plane (that is, such a direction as to separate from the center of the substrate W), and is thus disposed in a separating position B2 which is placed apart from the side surface of the substrate W. In other words, the cylinder 86 moves the chute-shaped portion 85 from the closing side end position C1 to the opening side end position C2 so that the interposing member 83 is moved from the interposing position B1 to the separating position B2.

On the other hand, when the cylinder 86 moves the chute-shaped portion 85 placed in the opening side end position C2 in such a direction as to approach the substrate W, the slide shaft portion 81 is slid together with the chute-shaped portion 85 in such a direction as to approach the substrate W. Consequently, the interposing member 83 placed in the separating position B2 is moved in such a direction as to approach the transverse center line of the substrate W (that is, in such a direction as to approach a center of the substrate W) in the horizontal plane. In a state in which the cylinder 86 moves the chute-shaped portion 85 to the closing side end position C1, the protruded portion 811 is set into such a state as to separate from a groove side wall portion of the chute-shaped portion 85 (preferably, such a state as to be disposed on almost the center of the groove of the chute-shaped portion 85), that is, such a state as not to receive force from the chute-shaped portion 85. In a state in which the chute-shaped portion 85 is disposed in the closing side end position C1, accordingly, the slide shaft portion 81 is maintained to be disposed in such a position (that is, the interposing position) B1 that the interposing member 83 is elastically energized at a predetermined pressure toward the side surface of the substrate W by means of the elastic member 84.

In other words, the interposing member 83 is caused to approach the substrate W in a supporting state through the cylinder 86 upon receipt of elastic energizing force from the elastic member 84 before a middle and is moved to the final interposing position B1 upon receipt of the elastic energizing force from the elastic member 84 after the middle while the cylinder 86 moves the chute-shaped portion 85 from the opening side end position C2 to the closing side end position C1. More specifically, the interposing member 83 is moved to an approaching position (that is, a predetermined position in which the interposing member 83 approaches or abuts on the side surface of the substrate W) from the separating position B2 upon receipt of driving force of the cylinder 86, and subsequently, is further moved from the approaching position to the interposing position B1 by only the elastic energizing force received from the elastic member 84 without depending on the driving force of the cylinder 86 and is thus energized elastically toward the side surface of the e substrate W at a predetermined pressure. As described above, each of the pair of the interposing members 83 is disposed in the interposing position B1. Consequently, the substrate W is brought into an interposing state through the pair of the interposing members 83 from both edge parts in a radial direction thereof.

According to the structure, each of the interposing members 83 is elastically energized by necessary and sufficient force for the substrate W. Therefore, it is possible to surely interpose the substrate W by the interposing portion 801 without damage. For example, if the elastic member is not provided but each of the interposing members is caused to interpose the substrate W by only the driving operation of the cylinder, a stopping position of the interposing member is uniquely fixed. In the case in which a position or a size of the substrate W is slightly different from a predetermined one, accordingly, there is a fear that the substrate W is broken because each interposing member is caused to excessively approach the side surface of the substrate W or the substrate W is dropped because each interposing member is disposed in an excessively distant position from the side surface of the substrate W. According to the structure, however, such a situation is caused with difficulty.

The interposing and inverting mechanism 80 is provided with an opening/closing detecting portion 800 for detecting the position state of the interposing members 83. The opening/closing detecting portion 800 is constituted by a pair of optical sensors 810 and 820, for example, and the sensor (a closing side sensor) 810 is disposed in the vicinity of the closing side end position C1 and detects the protruded portion 811 which is inserted into the groove of the chute-shaped portion 85 provided in the closing side end position C1. The sensor (the opening side sensor) 820 is disposed in the vicinity of the opening side end position C2 and detects the protruded portion 811 which is inserted into the groove of the chute-shaped portion 85 disposed in the opening side end position C2. As described above, the width of the groove of the chute-shaped portion 85 is set to be greater than that of the protruded portion 811, and the protruded portion 811 can take an optional position within the width of the groove. Accordingly, it is preferable that each of the sensors 810 and 820 should have a detection range of the approximately width of the groove of the chute-shaped portion 85 in the transverse direction.

According to the structure, when the chute-shaped portion 85 is moved to the closing side end position C1, the closing side sensor 810 detects the protruded portion 811. In other words, in the case in which the closing side sensor 810 detects the protruded portion 811, it can be decided that each of the interposing members 83 is disposed in a close position, and furthermore, is disposed in the interposing position B1 by means of the elastic member 84. On the other hand, when the chute-shaped portion 85 is moved to the opening side end position C2, the opening side sensor 820 detects the protruded portion 811. In other words, in the case in which the opening side sensor 820 detects the protruded portion 811, it can be decided that each of the interposing members 83 is disposed in the separating position B2. By detecting whether the pair of interposing members 83 interposes the substrate W through the opening/closing detecting portion 800, it is possible to safely invert the substrates W in the substrate inverting device 100.

Each of the slide shaft portions 81 is provided in penetration through each of the side wall portions of the housing 301 in an insertion state into a hollow rotating shaft portion 87. More specifically, the single rotating shaft portion 87 is provided rotatably in penetration through each of the left and right side wall portions of the housing 301, and the slide shaft portion 81 is slidably inserted into the rotating shaft portion 87. However, the protruded portion 811 is formed on the end of the slide shaft portion 81 as described above, and an insertion opening 871 for inserting the protruded portion 811 is formed on the rotating shaft portion 87. The insertion opening 871 takes a shape having a sufficient length in the transverse direction so as not to disturb the movement in the transverse direction of the protruded portion 811 with the sliding operation of the slide shaft portion 81.

Referring to the rotating shaft portion 87 and the slide shaft portion 81 to be internally inserted therein, for example, an end face of the protruded portion 811 (an end face in a circumferential direction of the slide shaft portion 81) is caught on an end face of the insertion opening 871 (an end face in a circumferential direction of the slide shaft portion 87) so that the slide shaft portion 81 cannot be rotated around an axis (a center line in an extending direction) in the rotating shaft portion 87. When the rotating shaft portion 87 is rotated around the axis (the rotating axis L), accordingly, the slide shaft portion 81 is also rotated around the rotating axis L together therewith.

Each of the pair of the rotating shaft portions 87 disposed opposite to each other in the transverse direction as seen in the vertical direction is extended in the transverse direction in the horizontal plane, and has one of ends protruded into the housing 301 and has the other end protruded to the outside of the housing 301. The pair of the rotating shaft portions 87 are coupled to the other rotating shaft portion 87 through a pair of auxiliary bars 88 at an end on the side protruded into the housing 301. The pair of the auxiliary bars 88 are disposed in division into the upper and lower sides of the two substrates W supported by the supporting mechanism 70, and are provided in extension in the transverse direction in the horizontal plane.

The bottom plate 872 closing the hollow portion of the rotating shaft portion (the rotating shaft portion on the plus Y side in the example of the drawing) 87a is attached to the end of the rotating shaft portion 87a at the side protruded to the outside of the housing 301 in the pair of the rotating shaft portions 87. As described above, the elastic member 84 is provided between the slide shaft portion 81 inserted into the hollow portion of the rotating shaft portion 87a and the bottom plate 872 closing the hollow portion.

The pulley 873 is attached to the end of the rotating shaft portion (the rotating shaft portion on the minus Y side in the example of the drawing) 87b at the side protruded to the outside of the housing 301 in the pair of the rotating shaft portions 87 in order to close the hollow portion of the rotating shaft portion 87b. As described above, the elastic member 84 is provided between the slide shaft portion 81 inserted into the hollow portion of the rotating shaft portion 87b and the pulley 873 closing the hollow portion.

The pulley 873 is provided in such a manner that a rotation center thereof is coincident with the rotating axis L of the rotating shaft portion 87. Moreover, a motor 89 is provided in the vicinity of the pulley 873 and a belt 891 for transmitting the driving force of the motor 89 to the pulley 873 is wound between the pulley 873 and the motor 89. With the structure, when the motor 89 is rotated, the rotating force is transmitted to the pulley 873 through the belt 891 so that the pulley 873 is rotated. Consequently, the rotating shaft portion 87b is rotated around the axis (the rotating axis) L.

As described above, the pair of the rotating shaft portions 87a and 87b are coupled to each other through the auxiliary bars 88. When the rotating shaft portion 87b is rotated around the rotating axis L, therefore, the rotating shaft portion 87a is also rotated synchronously around the axis (rotating axis) L. In other words, the rotating and driving force of the motor 89 coupled to the rotating shaft portion 87b is also transmitted to the rotating shaft portion 87a.

As described above, the slide shaft portion 81 cannot be rotated in the rotating shaft portions 87a and 87b. When the rotating shaft portions 87a and 87b are rotated by 180 degrees around the rotating axis L, accordingly, each of the slide shaft portions 81 is also rotated by 180 degrees around the rotating axis L. As a result, the supporting column 82 coupled to the slide shaft portion 81 is rotated by 180 degrees around a coupling part to the slide shaft portion 81 (that is, a central part in the extending direction of the supporting column 82) in a vertical plane. Consequently, the two substrates W interposed by the interposing members 83 provided in the supporting columns 82 are inverted by 180 degrees. In the interposing and inverting mechanism 80, thus, the two substrates W interposed by the two interposing portions 801 provided at an interval in the vertical direction can be inverted at a time.

<2-2. Operation of Substrate Inverting Device 100>

Figure 9:
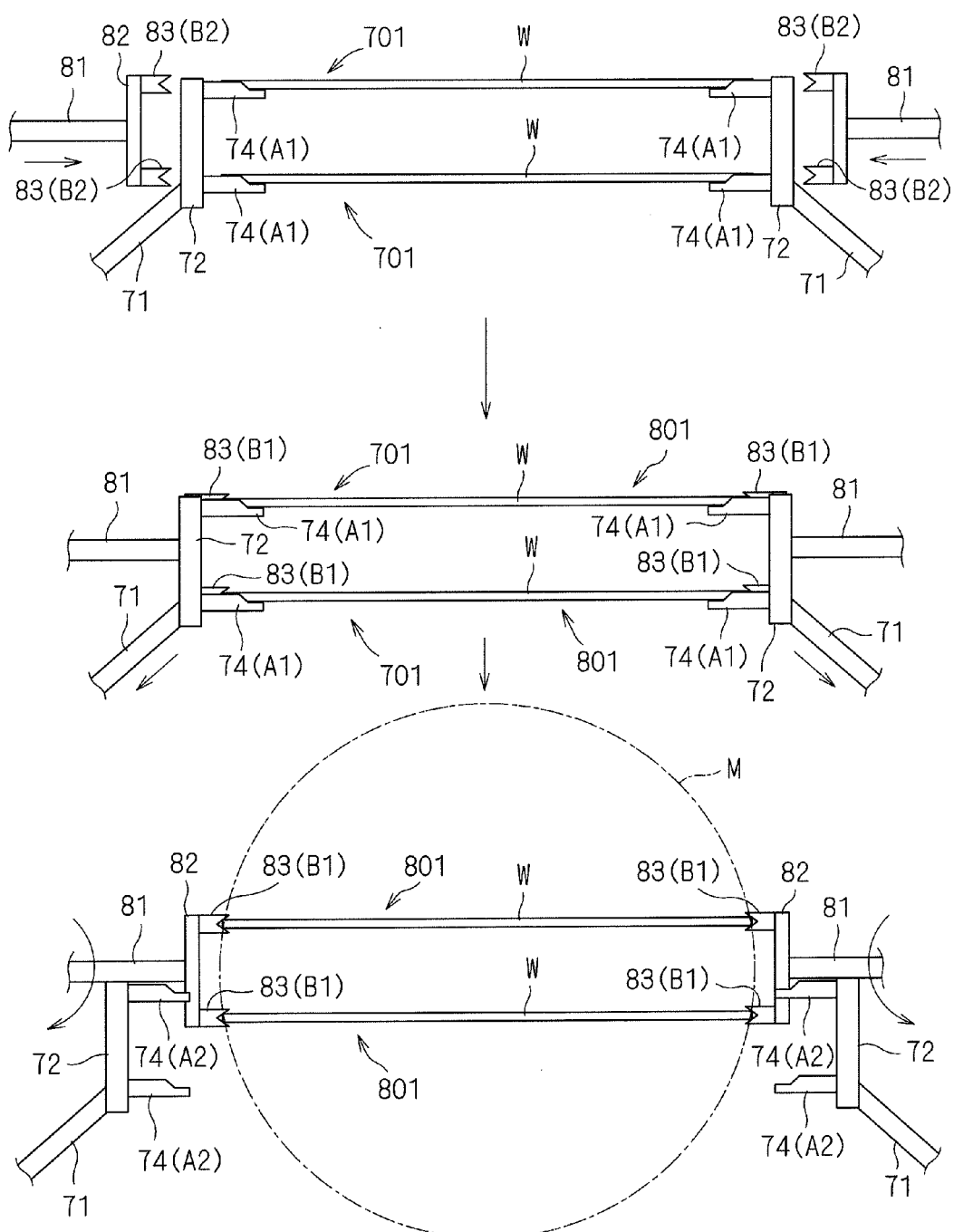
FIG. 9 is a typical view for explaining an operation of the substrate processing apparatus.

As described above, the supporting mechanism 70 and the interposing and inverting mechanism 80 constitute the substrate inverting device 100 for inverting the substrates W at a time. The operation of the substrate inverting device 100 will be described with reference to FIG. 9 in addition to FIGS. 4 to 8. FIG. 9 is a typical view for explaining the operation of the substrate inverting device 100. The operation of the substrate inverting device 100 is executed by controlling the respective portions 70 and 80 provided in the substrate inverting device 100 through the control portion 50. It is also possible to employ a structure in which a control portion for controlling the portions 70 and 80 provided in the substrate inverting device 100 is disposed in addition to the control portion 50 of the substrate processing apparatus 1 and the control portion 50 of the substrate processing apparatus 1 chiefly controls the control portion.

There will be described an operation for inverting the substrate W received from the transfer robot 12 and then transferring the inverted substrate W to the transport robot 22 through the substrate inverting device 100 provided in the transferring unit 30. However, an operation in the case in which the substrate inverting device 100 inverts the substrate W received from the transport robot 22 and then causes the transfer robot 12 to receive the inverted substrate W and an operation in the case in which the substrate inverting device 100 provided in the inverting portion 40 inverts the substrate W received from the transport robot 22 and then causes the transport robot 22 to receive the inverted substrate W again are also the same as an operation which will be described below.

In a state in which all of the supporting members 74 are disposed in the supporting position A1 and all of the interposing members 83 are disposed in the separating position B2, the transfer robot 12 causes the two transfer arms 121a and 121b supporting the respective substrates W one by one to enter the inner part of the housing 301 through the opening 303 and causes the upper supporting portion 701 to support the substrate W supported by the upper transfer arm 121a, and furthermore, causes the lower supporting portion 701 to support the substrate W supported by the lower transfer arm 121b. When the substrate W is supported by each of the supporting portions 701, the transfer robot 12 pulls the respective transfer arms 121a and 121b out of the inner part of the housing 301 through the opening 303. Consequently, the two substrates W are transferred from the transfer robot 12 to the supporting mechanism 70 and are maintained to be supported by the two supporting portions 701 in a state in which the two substrates W are laminated at an interval in the vertical direction in a horizontal posture (a state shown in an upper stage of FIG. 9).

When the two substrates W are supported by the two supporting portions 701, the cylinder 86 subsequently moves the chute-shaped portion 85 from the opening side end position C2 to the closing side end position C1. Consequently, the interposing member 83 is caused to approach the substrate W in a supporting state through the cylinder 86 upon receipt of the elastic energizing force from the elastic member 84 before the middle, and is moved to the interposing position B1 upon receipt of the elastic energizing force from the elastic member 84 after the middle. Each of the pair of the interposing members 83 is disposed in the interposing position B1 so that the substrate W is maintained to be interposed by the pair of the interposing members 83 from both edge parts in the radial direction. In other words, the substrate W supported by each inverting support portion 701 is maintained to be supported by the inverting support portion 701, and at the same time, to be interposed by the interposing portions 801 (a state shown in an intermediate stage of FIG. 9).

When the opening/closing detecting portion 800 detects the closing state, all of the supporting members 74 are subsequently moved synchronously from the supporting position A1 to the waiting position A2 by the driving operation of the cylinder 73. Consequently, each of the supporting members 74 is brought to be disposed on the outside of the inversion region M for the substrate W, and the two substrates W are brought to be interposed by the two interposing portions 801 in a lamination state at an interval in the vertical direction in the horizontal posture (a state shown in a lower stage of FIG. 9). As described above, the cylinder 73 moves the supporting member 74 in an obliquely downward direction and thus moves the supporting member 74 from the supporting position A1 to the waiting position A2. According to the structure, the supporting member 74 is moved in such a direction as to separate from both of the side and lower surfaces of the substrate W at the same time. For example, in the case in which the supporting member is moved in such a direction as to separate from only the side surface, the supporting member abutting on the lower surface of the substrate W is moved in contact with the substrate W in the supporting position A1. Consequently, there is a fear that the lower surface of the substrate W might be damaged. On the other hand, in the case in which the supporting member is moved in such a direction as to separate from only the lower surface, the supporting member collides with the substrate W at the lower side. According to the structure in accordance with the preferred embodiment, such a situation is not caused. In other words, it is possible to properly move the supporting member 74 to the waiting position A2 without damaging the substrate W by means of the supporting member 74.

When all of the supporting members 74 are moved from the supporting position A1 to the waiting position A2, the rotating shaft portions 87a and 87b are subsequently rotated by 180 degrees around the rotating axis L by the driving operation of the motor 89. Consequently, the pair of the sliding shaft portions 81 are also rotated by 180 degrees around the rotating axis L so that the supporting column 82 coupled to the slide shaft portion 81 is rotated by 180 degrees around the central part in the extending direction in the vertical plane. Thus, the substrate W interposed by the two interposing portions 801 is inverted by 180 degrees. In other words, the two substrates W received from the two inverting support portions 701 are inverted by 180 degrees at a time.

When the two substrates W are inverted, all of the supporting members 74 are subsequently moved synchronously from the waiting position A2 to the supporting position A1 by the driving operation of the cylinder 73. Consequently, the inverted substrate W interposed by the respective interposing portions 801 is brought to be interposed by the interposing portions 801, and at the same time, to be supported by the inverting support portion 701 (see the intermediate stage of FIG. 9).

When all of the supporting members 74 are moved from the waiting position A2 to the supporting position A1, the cylinder 86 subsequently moves the chute-shaped portion 85 from the closing side end position C1 to the opening side end position C2. Consequently, the interposing member 83 is moved from the interposing position B1 to the separating position B2. Thus, each of the interposing members 83 is brought to be disposed in a separating position from the substrate W, and the two substrates W are maintained to be supported by the two inverting support portions 701 in a lamination state at an interval in the vertical direction in the horizontal posture (see the upper stage of FIG. 9). In this state, the transport robot 22 causes two transport arms 221*a* and 221*b* to enter the inner part of the housing 301 through the opening 302, and transfers the substrate W supported on the inverting support portion 701 onto the respective transport arms 221*a* and 221*b*, and furthermore, pulls the two transport arms 221*a* and 221*b* supporting the substrate W out of the housing 301 through the opening 302.

<3. Operation of Substrate Processing Apparatus 1>

Figure 10:
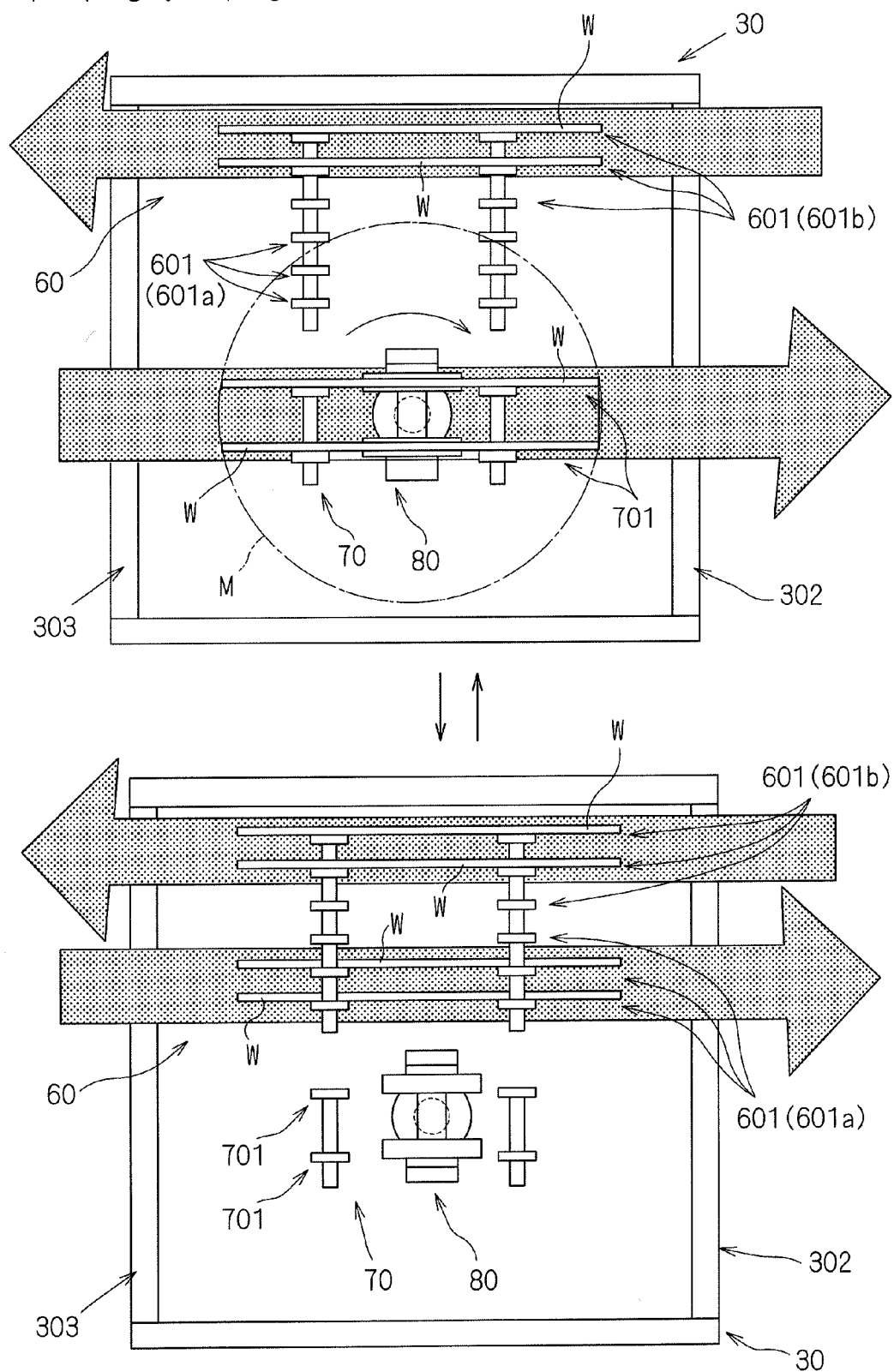
FIG. 10 is a typical view for explaining an operation for transferring a substrate.

Next, an operation of the whole substrate processing apparatus 1 will be described with reference to FIGS. 1 to 3 and FIG. 10. FIG. 10 is a typical view for explaining an operation for transferring the substrate W. The operation of the substrate processing apparatus 1 is executed by controlling each portion provided in the substrate processing apparatus 1 through the control portion 50.

As described above, the substrate processing apparatus 1 includes the front surface washing processing portion SS for carrying out the scrub washing processing over the front surface of the substrate W and the back surface washing processing portion SSR for carrying out the scrub washing processing over the back surface of the substrate W. Consequently, it is possible to carry out washing processing in various patterns depending on a purpose (for example, washing processing for washing only the front surface of the substrate W, washing processing for washing only the back surface of the substrate W, washing processing for washing both of the front surface and the back surface of the substrate W, and the like). Any washing processing to be executed is set by a recipe which describes a procedure for transporting the substrate W (a procedure for transporting the substrate is also referred to as a "flow") and a processing condition. The recipe is set every group of substrates W (for example, a substrate group on a lot unit). In the following, there will be described the operation of the substrate processing apparatus 1 in each of the case in which the washing processing for washing both surfaces of the substrate W is executed and the case in which the washing processing for washing only the front surface of the substrate W is executed depending on the recipe, for example.

<a. The Case in which the Both Surfaces of the Substrate W are Washed>

In this case, when the carrier C accommodating the unprocessed substrate W is delivered from the outside of the device into the carrier stage 11 of the indexer cell 10 by means of the AGV or the like, the transfer robot 12 of the indexer cell 10 takes two unprocessed substrates W from the carrier C through the transfer arms 121*a* and 121*b*, and transports the two unprocessed substrates W thus taken out to the transferring unit 30. In the substrate processing apparatus 1, however, the unprocessed substrate is transferred from the transfer robot 12 to the transport robot 22 by exclusively using the inverting support portion 701 and the feed supporting portion 601*a*. Moreover, any supporting portion to be used is selected depending on which processing procedure is set to the recipe, for example. For instance, it is assumed that the unprocessed substrate W is defined to be transferred by using the inverting support portion 701 in the case in which a processing procedure including back surface washing is set to the receipt, and the unprocessed substrate W is defined to be transferred by using the feed supporting portion 601*a* in the other cases. In the case in which the both surfaces of the substrate W are washed, accordingly, the transfer robot 12 transfers two unprocessed substrates W taken out of the carrier C to two inverting support portions 701 (an upper stage of FIG. 10).

When the two substrates W are brought to be supported by the two inverting support portions 701, the interposing and inverting mechanism 80 subsequently interposes the two substrates W supported by the two inverting support portions 701 to invert the front surfaces and the back surfaces of the two substrates W at a time, thereby bringing each of the substrates W into a state in which the back surface is turned upward. Then, the two inverting support portions 701 are caused to support the two substrates W thus inverted again. The operation of the substrate inverting device 100 has been described above.

When the two inverted substrates W are brought to be supported by the two inverting support portions 701, the transport robot 22 of the washing processing cell 20 receives the two substrates W from the two inverting support portions 701 by means of the transport arms 221*a* and 221*b*.

The transport robot 22 receiving the two inverted substrates W (that is, the two substrates W having the back surfaces turned upward) subsequently transports each of the two received substrates W to the back surface washing processing portion SSR. As described above, the washing processing unit 21*a* according to the preferred embodiment includes four back surface washing processing portions SSR disposed in lamination, and the transport robot 22 selects two optional ones of the four back surface washing processing portions SSR and transports the substrates W one by one to each of the two back surface washing processing portions SSR thus selected.

In each of the two back surface washing processing portions SSR into which the substrate W is transported, the back surface washing processing for the substrate W is executed. In other words, in each of the back surface washing processing portions SSR, a washing solution is supplied from the nozzle 213 to the back surface of the substrate W while the substrate W having the back surface turned upward is held by the spin chuck 211 and is thus rotated. In this state, the washing brush 212 abuts on or approaches the back surface of the substrate W to carry out scan in a horizontal direction so that the scrub washing processing is performed over the back surface of the substrate W.

When the back surface washing processing for the substrate W is ended in each back surface washing processing portion SSR, the transport robot 22 takes the substrate W subjected to the back surface washing processing out of each of the two back surface washing processing portions SSR in order by means of the transport arms 221a and 221b and transports the two substrates W thus taken out to the inverting portion 40 respectively.

In the inverting portion 40 into which the two substrates W subjected to the back surface washing processing are transported, the substrate inverting device 100 inverts the front surfaces and back surfaces of the two substrates W to bring the respective substrates W into a state in which the front surfaces are turned upward.

When the two substrates W are inverted by the inverting portion 40, the transport robot 22 receives the two inverted substrates W (that is, the two substrates W having the front surfaces turned upward) from the inverting portion 40 by means of the transport arms 221a and 221b and then transports each of the two received substrates W to the front surface washing processing portion SS. As described above, the washing processing unit 21b according to the preferred embodiment includes four front surface washing processing portions SS disposed in lamination, and the transport robot 22 selects two optional ones of the four front surface washing processing portions SS and transports the substrates W one by one to each of the two front surface washing processing portions SS thus selected.

In each of the two front surface washing processing portions SS into which the substrate W is transported, the front surface washing processing for the substrate W is executed. In other words, in each of the front surface washing processing portions SS, a washing solution is supplied from the nozzle 203 to the front surface of the substrate W while the substrate W having the front surface turned upward is held by the spin chuck 201 and is thus rotated. In this state, the washing brush 202 abuts on or approaches the front surface of the substrate W to carry out scan in the horizontal direction so that the scrub washing processing is performed over the front surface of the substrate W.

When the front surface washing processing for the substrate W is ended in each of the front surface washing processing portions SS, the transport robot 22 takes the substrate W subjected to the front surface washing processing out of each of the two front surface washing processing portions SS in order by means of the transport arms 221a and 221b and transports each of the two substrates W thus taken out to the return supporting portion 601b.

When the processed substrate W is mounted on the return supporting portion 601b, the transfer robot 12 of the indexer cell 10 takes the processed substrate W out by means of the transfer arms 121a and 121b and stores the processed substrate W in the carrier C. In other words, the processed substrate W is transferred from the transport robot 22 to the transfer robot 12 through the return supporting portion 601b.

<b. The Case in which Only the Front Surface of the Substrate W is Washed>

In this case, when the carrier C accommodating the unprocessed substrate W is delivered from the outside of the device into the carrier stage 11 of the indexer cell 10 by means of the AGV or the like, the transfer robot 12 of the indexer cell 10 takes two unprocessed substrates W from the carrier C through the transfer arms 121a and 121b, and transports the two unprocessed substrates W thus taken out to the transferring unit 30. As described above, in the substrate processing apparatus 1, the unprocessed substrate is transferred from the transfer robot 12 to the transport robot 22 by exclusively using the inverting support portion 701 and the feed supporting portion 601a. In the case in which a processing procedure including no back surface washing is set to the recipe, however, the unprocessed substrate W is defined to be transferred by using the feed supporting portion 601a. In the case in which only the front surface of the substrate W is washed, accordingly, the transfer robot 12 transfers the two unprocessed substrates W taken out of the carrier C to two feed supporting portions 601a (a lower stage of FIG. 10).

When the two substrates W are brought to be supported by the two feed supporting portions 601a, the transport robot 22 receives the two unprocessed substrates W from the two feed supporting portions 601a by means of the transport arms 221a and 221b.

The transport robot 22 receiving the two substrates W (that is, the two substrates W having the front surfaces turned upward) subsequently transports each of the two received substrates W to the front surface washing processing portion SS. Similarly, the transport robot 22 selects two optional ones of the four front surface washing processing portions SS provided in the washing processing unit 21b and transports the substrates W one by one to each of the two front surface washing processing portions SS thus selected.

In each of the two front surface washing processing portions SS into which the substrate W is transported, the front surface washing processing for the substrate W is executed.

When the front surface washing processing for the substrate W is ended in each front surface washing processing portion SS, the transport robot 22 takes the substrate W subjected to the front surface washing processing out of each of the two front surface washing processing portions SS in order by means of the transport arms 221a and 221b and transports the two substrates W thus taken out to the return supporting portion 601b respectively.

When the processed substrate W is mounted on the return supporting portion 601b, the transfer robot 12 of the indexer cell 10 takes the processed substrate W out by means of the transfer arms 121a and 121b and stores the processed substrate W in the carrier C. In other words, the processed substrate W is transferred from the transport robot 22 to the transfer robot 12 through the return supporting portion 601b.

As described above, in the substrate processing apparatus 1, in the case in which the processing procedure including the back surface washing is set to the recipe, the control portion 50 causes the respective transfer robot 12 and transport robot 22 to transfer the unprocessed substrate W through the inverting support portion 701, and furthermore, causes the substrate inverting device 100 to carry out the processing for inverting the substrate W in the transfer (an upper stage of FIG. 10). In this case, the unprocessed substrate W is not transported to the feed supporting portion 601a but the unprocessed substrate W is exclusively transferred through the inverting support portion 701 from the transfer robot 12 to the transport robot 22. On the other hand, in the case in which the processing procedure including no back surface washing is set to the recipe, the control portion 50 causes the transfer robot 12 and the transport robot 22 to transfer the unprocessed substrate W through the feed supporting portion 601a (a lower stage of FIG. 10). In this case, the unprocessed substrate W is not transported into the inverting support portion 701 but the unprocessed substrate W is exclusively transferred through the feed supporting portion 601a from the transfer robot 12 to the transport robot 22.

In the substrate processing apparatus 1, thus, a path for transferring the unprocessed substrate W from the transfer robot 12 to the transport robot 22 includes two paths, that is, a transfer path through the inverting support portion 701 and a transfer path through the feed supporting portion 601a, and the control portion 50 selects one of the transfer paths depending on the recipe. When the recipe is to be changed, moreover, the control portion 50 switches the transfer path for the unprocessed substrate W if necessary. For example, in the case in which the recipe to which the processing procedure including the back surface washing is set is switched into the recipe to which the processing procedure including no back surface washing is set, the control portion 50 switches the transfer path for the unprocessed substrate W from the transfer path through the inverting support portion 701 to the transfer path through the feed supporting portion 601a. On the other hand, in the case in which the recipe to which the processing procedure including no back surface washing is set is switched into the recipe to which the processing procedure including the back surface washing is set, the control portion 50 switches the path for transferring the unprocessed substrate W from the transfer path through the feed supporting portion 601a to the transfer path through the inverting support portion 701. In the former case, however, the transfer robot 12 transports the unprocessed substrate W related to a new recipe into the feed supporting portion 601a after the interposing and inverting mechanism 80 inverts the unprocessed substrate W (the unprocessed substrate W related to the previous recipe) supported by the inverting support portion 701 (preferably the unprocessed substrate W is delivered out by the transport robot 22). In the latter case, moreover, the transfer robot 12 transports the unprocessed substrate W related to a new recipe into the inverting support portion 701 after the unprocessed substrate W (the unprocessed substrate W related to the previous recipe) supported by the feed supporting portion 601a is delivered out by the transport robot 22. When the recipe is to be switched, consequently, it is possible to avoid a situation in which the unprocessed substrate W supported by the feed supporting portion 601a to be an interference supporting portion collides with the substrate W to be inverted by the interposing and inverting mechanism 80.

<4. Effect>

According to the preferred embodiment, the transferring unit 30 includes the inverting support portion 701 and the supporting portion 601 which are disposed at an interval in the vertical direction. Therefore, it is possible to transfer the substrate W between the transport robot 22 and the transfer robot 12 through at least one of the inverting support portion 701 and the supporting portion 601. In particular, it is possible to invert and transfer the substrate W through the inverting support portion 701. At least one of the supporting portions 601 is caused to be the interference supporting portion. The supporting portion 601 serving as the interference supporting portion supports the substrate W in the inversion region M for the substrate W to be inverted by the interposing and inverting mechanism 80. Accordingly, it is possible to reduce a height dimension of the transferring unit 30. Consequently, it is possible to suppress increase in travel distances in the vertical direction of the transport robot 22 and the transfer robot 12. Thus, it is possible to effectively suppress reduction in a throughput of the substrate processing apparatus 1. Moreover, it is possible to reduce the sizes of the transport robot 22 and the transfer robot 12. By effectively utilizing a space generated through reduction in the size of the transferring unit 30, furthermore, it is also possible to reduce the size of the substrate processing apparatus 1.

For example, as shown in FIG. 3, the transfer robot 12 needs, at a minimum, a vertical stroke range (a carrier catching range) HC required for transferring the substrate W together with the carrier C provided on the carrier stage 11. In order to effectively reduce the vertical stroke range of the transfer robot 12, accordingly, it is preferable that a vertical stroke range (a transferring unit catching range) H30 required for transferring the substrate W together with the transferring unit 30 should approximate to the carrier catching range HC as greatly as possible.

The carrier catching range HC is defined depending on a height dimension of the carrier C, and the transferring unit catching range H30 is defined depending on the height dimension of the transferring unit 30. Even if the size of the substrate W is increased, generally, the height dimension of the carrier C is not increased. If the size of the substrate W is increased, however, the inversion region M for the substrate W is enlarged. According to the preferred embodiment, at least one of the supporting portions 601 is set to be the interference supporting portion. Consequently, it is possible to suppress the increase in the height dimension of the transferring unit 30 with the enlargement of the inversion region M. In other words, even if the size of the substrate W is increased, the transferring unit catching range H30 can be maintained to approximate to the carrier catching range HC. As a result, it is possible to suppress increase in the stroke range of the transfer robot 12. Thus, it is possible to effectively suppress the reduction in the throughput of the substrate processing apparatus 1.

According to the preferred embodiment, moreover, the unprocessed substrate W is transferred from the transfer robot 12 to the transport robot 22 through either the inverting support portion 701 or the feed supporting portion 601a (that is, by exclusively using the supporting portions 701 and 601a). According to the structure, there is not caused a situation in which the inverting support portion 701 and the feed supporting portion 601a are used for transferring the substrate W at the same time. Therefore, it is possible to reliably avoid a situation in which the substrate W supported by the feed supporting portion 601a (the feed supporting portion 601a serving as the interference supporting portion) interferes with the substrate W to be inverted by the interposing and inverting mechanism 80.

According to the preferred embodiment, moreover, the path for transferring the unprocessed substrate W from the transfer robot 12 to the transport robot 22 is selectively switched between the transferring path through the inverting support portion 701 and the transferring path through the feed supporting portion 601a depending on the recipe set every substrate group. According to the structure, for example, the device can automatically select the transferring path to carry out the processing through selection of the processing for only the front surface or the processing for both sides depending on the recipe.

According to the preferred embodiment, furthermore, the feed supporting portion 601a is disposed on the upper side of the inverting support portion 701. According to the structure, a path for passage of the unprocessed substrate W to be transferred through the feed supporting portion 601a (that is, the unprocessed substrate W to be transferred without inversion with the front surface turned upward) is formed on the upper side of the interposing and inverting mechanism 80. Accordingly, it is hard for the front surface of the unprocessed substrate W to be contaminated with particles or the like which are generated by a driving mechanism of the interposing and inverting mechanism 80 or the like.

According to the preferred embodiment, moreover, the processed substrate W is transferred from the transport robot 22 to the transfer robot 12 through the return supporting portion 601b disposed on the upper side of the feed supporting portion 601a. According to the structure, the path for passage of the processed substrate W is formed on the upper side of the path for passage of the unprocessed substrate W. Therefore, it is possible to maintain the front surface of the processed substrate W to be clean.

In the substrate processing apparatus 1 according to the preferred embodiment, furthermore, the substrate inverting devices 100 provided in the transferring unit 30 and the inverting portion 40 respectively can properly invert two substrates W at a time. Consequently, it is possible to enhance a throughput in the substrate processing apparatus 1. In the substrate processing apparatus 1, particularly, it is possible to invert the front surface and the back surface of the substrate W when transferring the substrate W between the transfer robot 12 and the transport robot 22. In other words, the substrate inverting device 100 also functions as a portion for transferring the substrate W between the transfer robot 12 and the transport robot 22 in addition to the function for inverting the substrate W. According to the structure, for example, a burden of the transport robot 22 can be relieved, and furthermore, the number of processing steps in the washing processing cell 20 can be decreased so that reduction in the throughput of the substrate processing apparatus 1 can be suppressed effectively as compared with the case in which the transferring portion and the inverting portion are provided separately from each other.

<5. Variant>

Although the supporting unit 60 has such a structure as to include six supporting portions 601 in the preferred embodiment, the number of the supporting portions 601 provided in the supporting unit 60 does not always need to be six. Furthermore, it is possible to optionally set any position in the supporting portions 601 provided in the supporting unit 60 and the number of the supporting portions 601 which are to be used as the feed supporting portion 601a (or the return supporting portion 601b). For example, they can be set by acceptance of an input from an operator through the control portion 50. Although all of the supporting portions 601 serving as the interference supporting portions are used as the supporting portions 601a in the preferred embodiment, at least one (or all) of the supporting portions 601 serving as the interference supporting portions may be used as the return supporting portion 601b. For example, three lower ones of the six supporting portions 601 may be used as the return supporting portions 601b. In this case, all of the supporting portions 601 serving as the interference supporting portions are used as the return supporting portions 601b. In the present variant, however, it is necessary to appropriately adjust an operation schedule in such a manner that the substrate W is not delivered into the supporting portion 601 to be the interference supporting portion while an operation for inverting the substrate W is carried out in the substrate inverting device 100 and the operation for inverting the substrate W is not carried out in the substrate inverting device 100 while the substrate W is supported by the supporting portion 601 serving as the interference supporting portion.

In the preferred embodiment, moreover, the inverting support portion 701 may be used for transferring the return substrate W. For example, it is also possible to employ a structure in which the processed substrate W is transferred from the transport robot 22 to the transfer robot 12 through the inverting support portion 701 and the processed substrate W is inverted and is thus transferred to the transfer robot 12 in the case in which only the back surface of the substrate W is washed. Also in the present variant, however, it is necessary to appropriately adjust an operation schedule in such a manner that the substrate W is not delivered into the supporting portion 601 to be the interference supporting portion while the operation for inverting the substrate W is carried out in the substrate inverting device 100 and the operation for inverting the substrate W is not carried out in the substrate inverting device 100 while the substrate W is supported by the supporting portion 601 serving as the interference supporting portion in the same manner as the variant described above.

Although there is employed the structure in which the supporting portions 601 provided in the supporting unit 60 are disposed on the upper side of the inverting support portions 701 in the preferred embodiment, moreover, at least one supporting portion 601 may be disposed on the lower side of the inverting support portions 701.

In the preferred embodiment, furthermore, the inverting portion 40 may be disposed in the housing 301 of the transferring unit 30. In this case, the single substrate inverting device 100 is disposed on each of the upper and lower sides with the supporting unit 60 interposed in the housing 301 of the transferring unit 30. At least one of the supporting portions 601 provided in the supporting unit 60 which is placed on the upper side may be caused to serve as the interference supporting portion for supporting the substrate W in the inversion region for the substrate W in the substrate inverting device 100 at the upper side, and furthermore, at least one supporting portion 601 at the lower side may be caused to serve as the interference supporting portion for supporting the substrate W in the inversion region for the substrate W in the substrate inverting device 100 at the lower side. According to the structure, it is possible to reduce a total height dimension including the inverting portion 40 and the transferring unit 30. Also in this case, however, it is necessary to adjust an operation schedule in such a manner that the substrate W is not delivered into the interference supporting portion at the upper side (the lower side) while the operation for inverting the substrate W is carried out in the substrate inverting device 100 at the upper side (the lower side) and the operation for inverting the substrate W is not carried out in the substrate inverting device 100 at the upper side (the lower side) while the substrate W is supported by the interference supporting portion at the upper side (the lower side).

Although the substrate inverting device 100 serves to invert two substrates W at the same time in the preferred embodiment, furthermore, the substrate inverting device 100 may serve to invert the single substrate W or to invert at least three substrates W at the same time. For example, by disposing four supporting members 74 on each supporting column 72 in the supporting mechanism 70 and disposing four interposing members 83 on each supporting column 82 in the interposing and inverting mechanism 80, it is possible to invert four substrates W at the same time.

In the preferred embodiment, moreover, the layout of the front surface washing processing portion SS and the back surface washing processing portion SSR and the numbers of the respective processing portions to be mounted in each of the washing processing units 21a and 21b are not restricted to those described above. Moreover, the position in which the inverting portion 40 is to be disposed is not restricted to that described above. For example, the inverting portion 40 may be disposed on the lower side of the transferring unit 30 or may be disposed in the washing processing cell 20.

In the substrate inverting device 100 according to the preferred embodiment, furthermore, a detecting portion for detecting an abnormality of the corresponding substrate W may be provided corresponding to each of the two substrates W supported by the supporting mechanism 70. The detecting portion can detect the presence of the corresponding substrate W, an abnormality of a posture and the like by means of an optical sensor or the like, for example.

While the invention has been shown and described in detail, the foregoing description is in all aspects illustrative and not restrictive. It is therefore understood that numerous modifications and variations can be devised without departing from the scope of the invention.

What is claimed is:

1. A substrate processing method, comprising the steps of:
   a) transferring a substrate from a second transport robot disposed in an indexer block to a first transport robot disposed in a processing block through a transferring unit disposed in a connecting part of said processing block and said indexer block;
   said processing block including a front surface washing portion for washing a said front surface of said substrate and a back surface washing portion for washing a back surface of said substrate;
   said transferring unit including an inverting support portion for supporting said substrate in a horizontal posture, a feed supporting portion disposed on an upper side of said inverting support portion at an interval in a vertical direction from said inverting support portion for supporting said substrate in a horizontal posture, and a return supporting portion disposed on an upper side of said feed supporting portion for supporting said substrate in a horizontal posture;
   wherein transferring said substrate from said second transport robot to said first transport robot through the transferring unit includes transferring said substrate from the second transport robot to the inverting supporting portion, inverting said substrate by an inverting mechanism wherein said substrate is inverted in an inversion region, bringing said inverted substrate to be supported by said inverting support portion, and transferring said inverted substrate from said inverting support portion to said first transport robot;
   b) processing said inverted substrate in said processing block and the first transport robot retrieves the processed substrate after processing; and
   c) transferring said processed substrate from said first transport robot to said second transport robot through said return supporting portion of said transferring unit;
   wherein,
   said feed supporting portion has a plurality of supporting members disposed in the same horizontal plane;
   said feed supporting portion is disposed at an interval in a vertical direction from said inverting support portion such that said horizontal plane where said plurality of supporting members of the feed supporting portion are disposed interferes with said inversion region;
   said return supporting portion has a plurality of supporting members disposed in the same horizontal plane; and
   said return supporting portion is disposed at an interval in a vertical direction from said inverting support portion such that said horizontal plane where said plurality of supporting members of the return supporting portion are disposed does not interfere with said inversion region.

2. The substrate processing method according to claim 1, comprising
   a plurality of said inverting support portions, a plurality of substrates being supported by said inverting support portions and being inverted at a time.

* * * * *